(12) United States Patent
Yoshida

(10) Patent No.: US 11,106,153 B2
(45) Date of Patent: Aug. 31, 2021

(54) IMAGE FORMING APPARATUS

(71) Applicant: CANON KABUSHIKI KAISHA, Tokyo (JP)

(72) Inventor: Hidefumi Yoshida, Abiko (JP)

(73) Assignee: Canon Kabushiki Kaisha, Tokyo (JP)

( * ) Notice: Subject to any disclaimer, the term of this patent is extended or adjusted under 35 U.S.C. 154(b) by 79 days.

(21) Appl. No.: 16/448,223

(22) Filed: Jun. 21, 2019

(65) Prior Publication Data

US 2020/0004173 A1 Jan. 2, 2020

(30) Foreign Application Priority Data

Jun. 27, 2018 (JP) .............................. JP2018-121822

(51) Int. Cl.
*G03G 15/043* (2006.01)
*G11C 7/22* (2006.01)

(52) U.S. Cl.
CPC .......... *G03G 15/043* (2013.01); *G11C 7/222* (2013.01)

(58) Field of Classification Search
CPC ............................. G03G 15/04; G03G 15/043
See application file for complete search history.

(56) References Cited

U.S. PATENT DOCUMENTS

| 2011/0122218 A1* | 5/2011 | Inoue | G03G 15/326 347/237 |
| 2017/0019561 A1* | 1/2017 | Furuta | H04N 1/113 |
| 2018/0004115 A1* | 1/2018 | Iwata | G03G 15/5054 |

FOREIGN PATENT DOCUMENTS

JP 2001-315379 A 11/2001

* cited by examiner

*Primary Examiner* — Erika J Villaluna
(74) *Attorney, Agent, or Firm* — Venable LLP

(57) ABSTRACT

An image forming apparatus includes an exposure portion including a plurality of surface emitting elements configured to expose a photosensitive member, a drive unit configured to turn ON the surface emitting elements based on image information, and a light amount control unit configured to adjust a drive current value to control an amount of light to be emitted from the surface emitting elements; and a controller configured to output the image information to the exposure portion. The controller includes a light amount adjustment unit configured to correct the image information based on an adjustment value to adjust the amount of light to be emitted from the surface emitting elements and a medium tone processing unit configured to quantize the image information corrected by the light amount adjustment unit by error diffusion to reduce a number of tones in the image information.

12 Claims, 21 Drawing Sheets

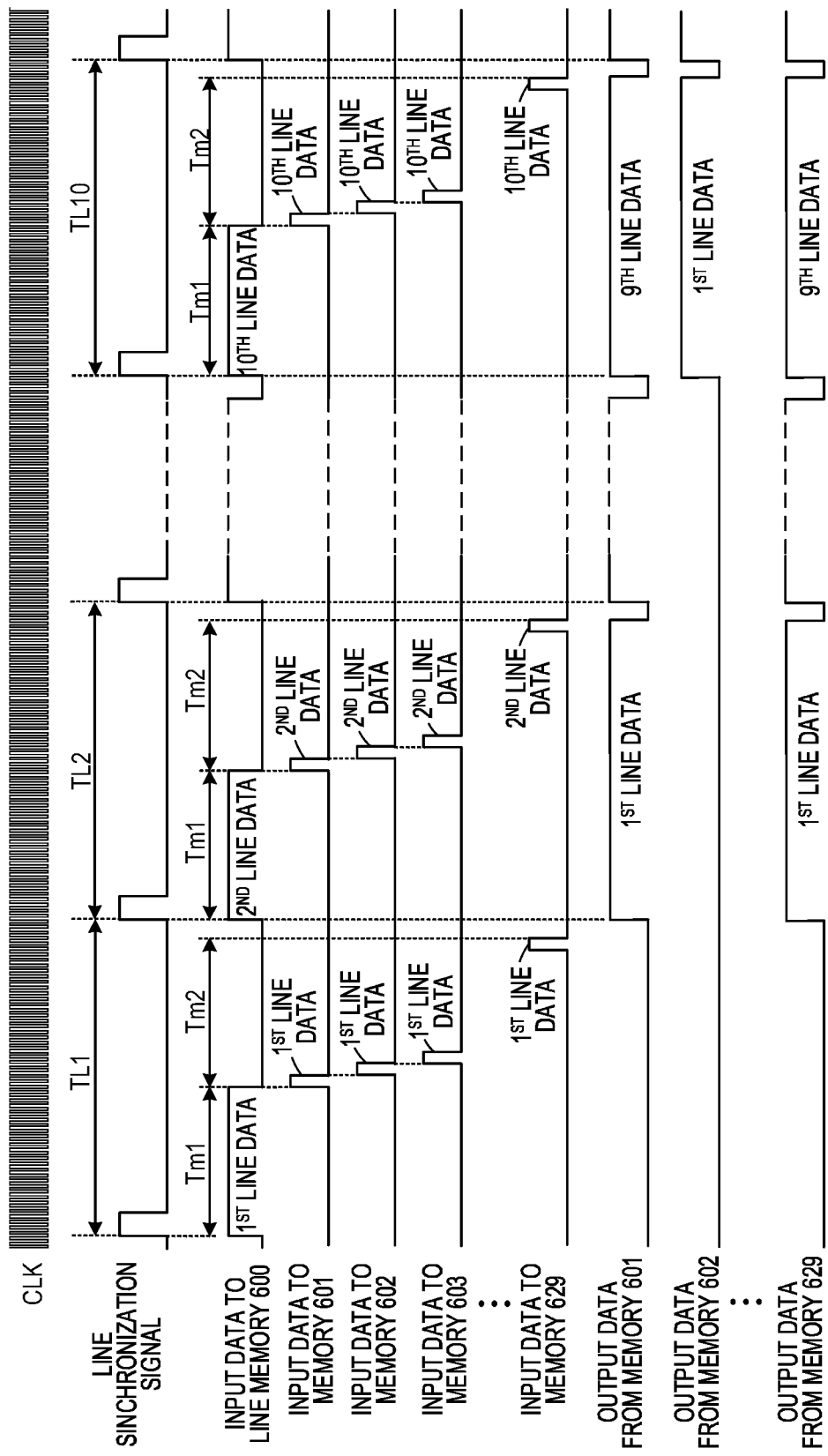

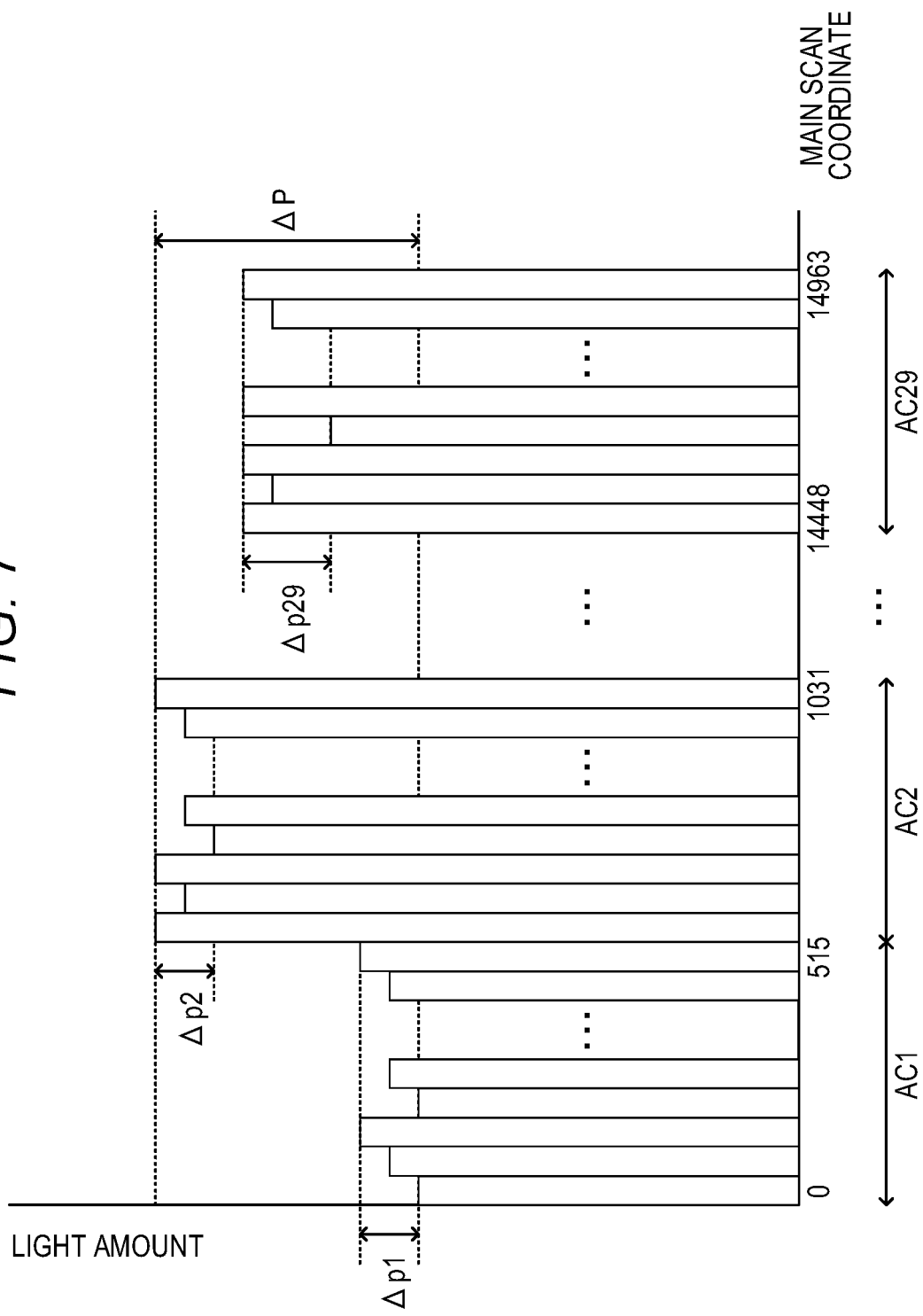

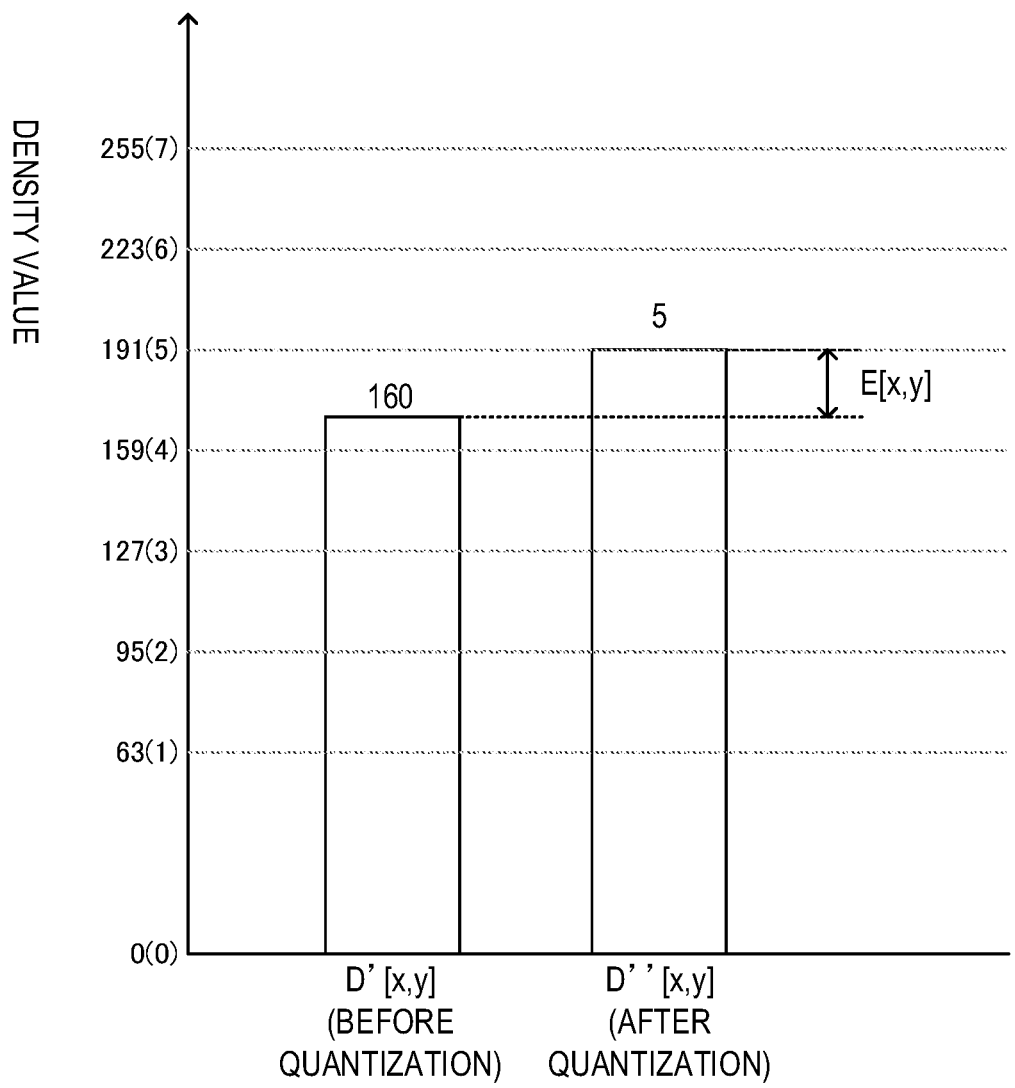

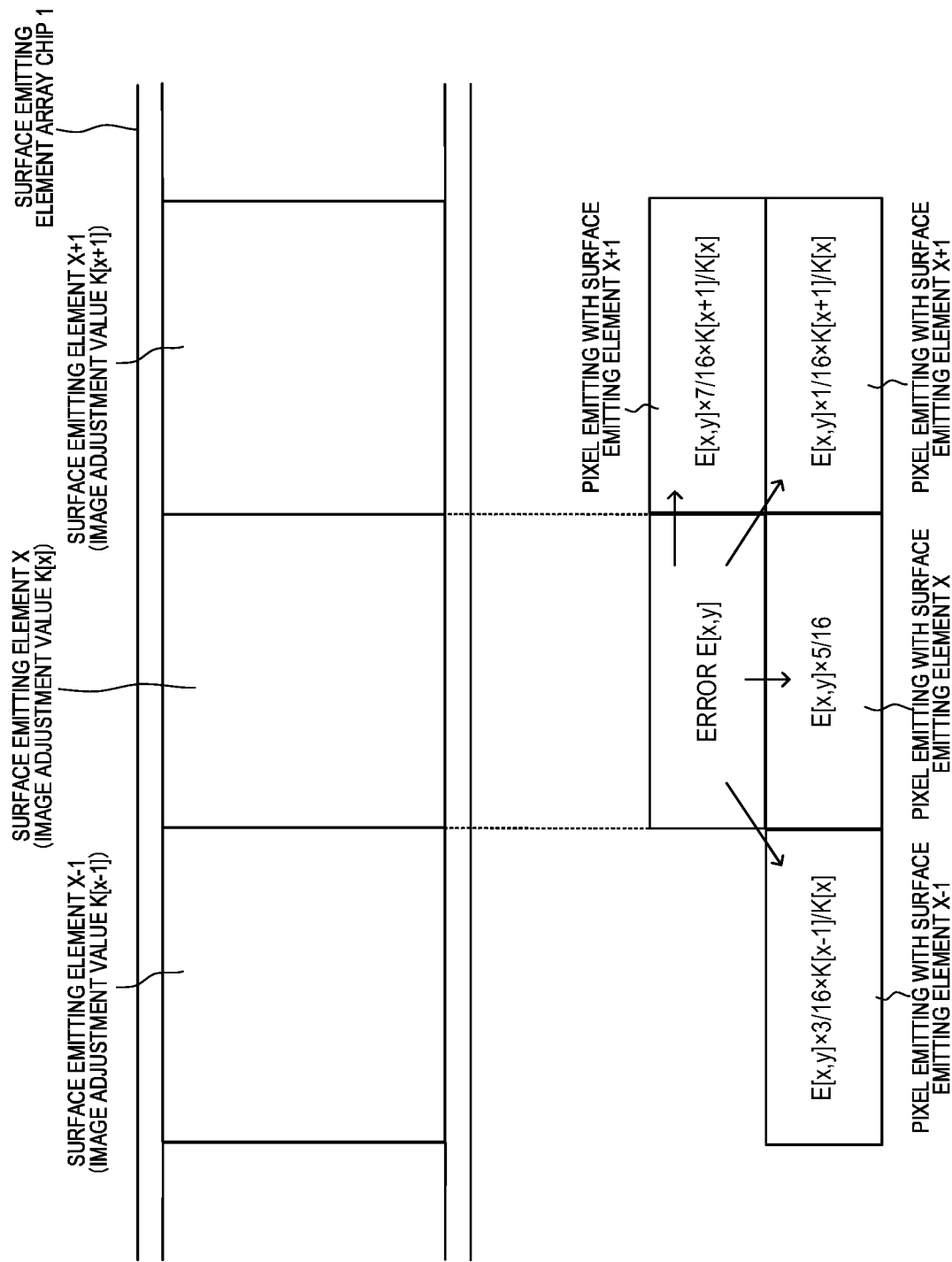

DIFFUSION ERROR A = $E[x-1, y-1] \times 1/16 \times B_1$

DIFFUSION ERROR B = $E[x, y-1] \times 5/16$

DIFFUSION ERROR C = $E[x-1, y] \times 7/16 \times B_1$

DIFFUSION ERROR D = $E[x+1, y-1] \times 3/16$

DIFFUSION ERROR A = E[x-1, y-1]×1/16

DIFFUSION ERROR B = E[x, y-1]×5/16

DIFFUSION ERROR C = E[x-1, y]×7/16

DIFFUSION ERROR D = E[x+1, y-1]×3/16×$B_2$

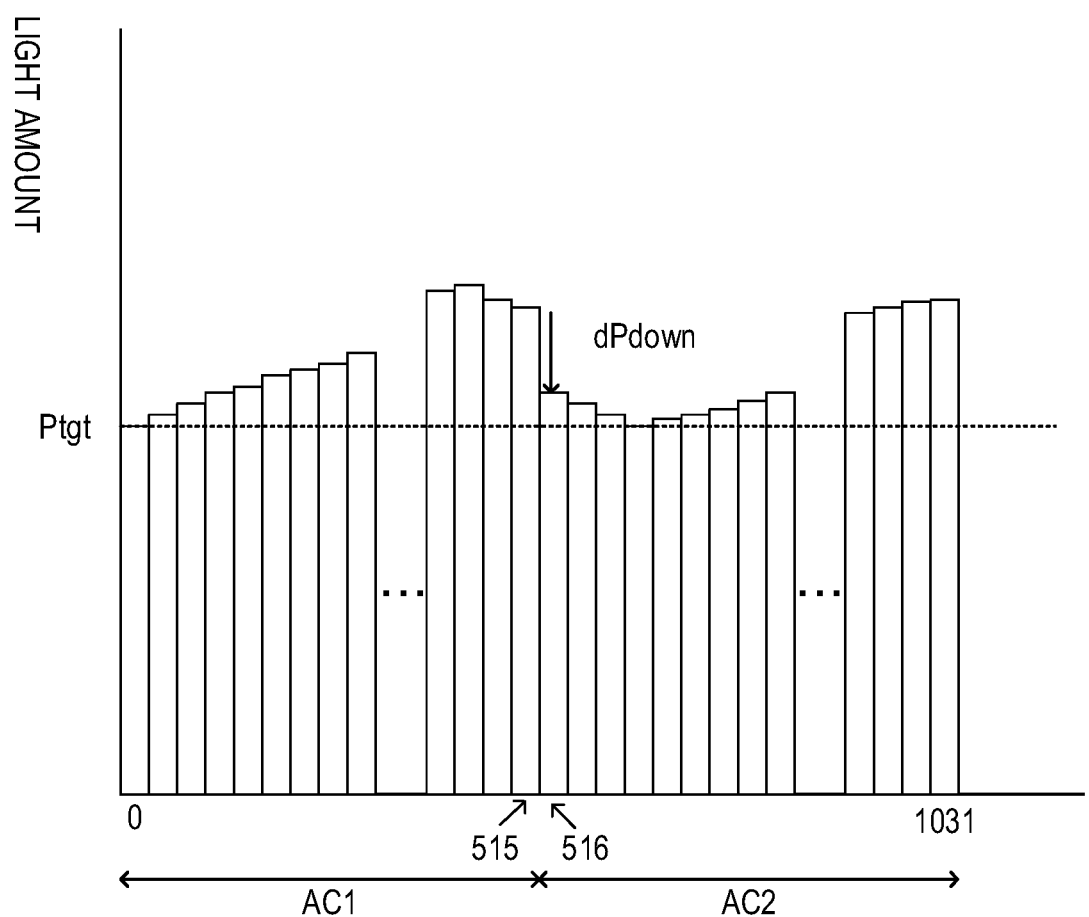

IMAGE FORMING APPARATUS

BACKGROUND OF THE INVENTION

Field of the Invention

The present invention relates to an electrophotographic image forming apparatus.

Description of the Related Art

With regard to a printer being an electrophotographic image forming apparatus, a method which uses an exposure head to expose a photosensitive drum and form a latent image is generally known. In the exposure head, a light emitting diode (LED) or an organic electro luminescence (EL) diode or element is used, for example. The exposure head includes rows of light emitting elements arranged in a longitudinal direction of the photosensitive drum and a rod lens array configured to cause light beams from the rows of light emitting elements to form an image on the photosensitive drum. A known configuration of the LED or the organic EL element has a surface emitting shape, in which a direction of illuminating light from a light emitting surface is matched with a direction of the rod lens array. A length of each of the rows of the light emitting elements is determined by a width of an image region on the photosensitive drum, and intervals between the light emitting elements are determined by a resolution of the printer. For example, in the case of a 1,200 dpi printer, intervals between pixels are 21.16 µm, and accordingly the intervals between the light emitting elements have values corresponding to 21.16 µm. A printer using such an exposure head uses fewer components than those used in a laser scanning printer, in which a photosensitive drum is scanned with a laser beam deflected by a rotary polygon mirror. Therefore, it is easier to reduce the size and cost of the apparatus. In addition, in the printer using the exposure head, sound resulting from the rotation of the rotary polygon mirror is reduced.

However, even when the surface emitting elements included in the exposure head are turned ON under the same conditions, an amount of light emitted from the surface emitting elements generally varies to cause a defective image such as a streak or unevenness. To prevent this, in the printer using the exposure head, a pulse width of a drive signal is adjusted or a supplied current value is adjusted, to thereby perform correction for allowing each of the surface emitting elements to emit an equal amount of light. For example, in Japanese Patent Application Laid-Open No. 2001-315379, there are provided a light amount adjustment unit configured to adjust an amount of light emitted from all the surface emitting elements included in an exposure head and a light amount adjustment unit configured to adjust an amount of light emitted from each of the surface emitting elements based on tone signals for individual dots in accordance with an image signal. Thus, a method for correcting an emitted light amount through use of a simple circuit configuration is proposed.

However, in a method which provides a light amount adjustment unit for all surface emitting elements and a light amount adjustment unit for each of the surface emitting elements as described in Japanese Patent Application Laid-Open No. 2001-315379, the number of bits in tone data with which an emitted light amount is adjusted is increased. Accordingly, when pulse width control using a triangle wave as described in an embodiment of Japanese Patent Application Laid-Open No. 2001-315379 is performed in a multi-bit configuration, a high-accuracy DA converter (DAC) is required. This causes an error resulting from heat, variations in power supply voltage, or the like. In addition, it is required to correct each of pixels and consequently switch output of the DAC at a time when each of the pixels is lit up. As a result, a response speed of the DAC is required to be increased, resulting in the problem of a complicated circuit.

SUMMARY OF THE INVENTION

The present invention has been made in view of the above-mentioned circumstances, and provides an image forming apparatus configured to correct variations between respective amounts of light emitted from surface emitting elements through use of a smaller amount of image data.

According to an embodiment, there is provided an image forming apparatus comprising:
 a photosensitive member;
 an exposure portion, which includes a plurality of surface emitting elements, and is configured to expose the photosensitive member by the plurality of surface emitting elements, the exposure portion including:
  a plurality of surface emitting element array chips each including the plurality of surface emitting elements configured to expose the photosensitive member;
  a drive unit configured to turn ON each of the plurality of surface emitting elements based on image information; and
  a light amount control unit configured to adjust a drive current value of a drive current to be supplied to the drive unit for each of the plurality of surface emitting element array chips to control an amount of light to be emitted from each of the plurality of surface emitting elements of the plurality of surface emitting element array chips; and
 a controller configured to output the image information to the exposure portion to control image formation, the controller including:
  a light amount adjustment unit configured to correct the image information for causing each of the plurality of light emitting elements to emit light based on an adjustment value provided for each of the plurality of surface emitting elements, to thereby adjust the amount of light to be emitted from each of the plurality of surface emitting elements; and
  a medium tone processing unit configured to quantize the image information corrected by the light amount adjustment unit by error diffusion to reduce a number of tones in the image information.

Further features of the present invention will become apparent from the following description of exemplary embodiments with reference to the attached drawings.

BRIEF DESCRIPTION OF THE DRAWINGS

FIG. 6B is a timing chart.

FIG. 7 is a graph for showing an amount of light from each of surface emitting elements in the surface emitting element array chips in each of the first to fourth embodiments.

FIG. 11 is a graph for showing a relationship between quantization and a quantization error in each of the first to fourth embodiments.

FIG. 13 is a diagram for illustrating a method of diffusing the quantization error in the second embodiment.

FIG. 17A and FIG. 17B are graphs for showing an amount of light from each of the surface emitting elements after the drive current adjustment in the fourth embodiment.

DESCRIPTION OF THE EMBODIMENTS

Figure 1:
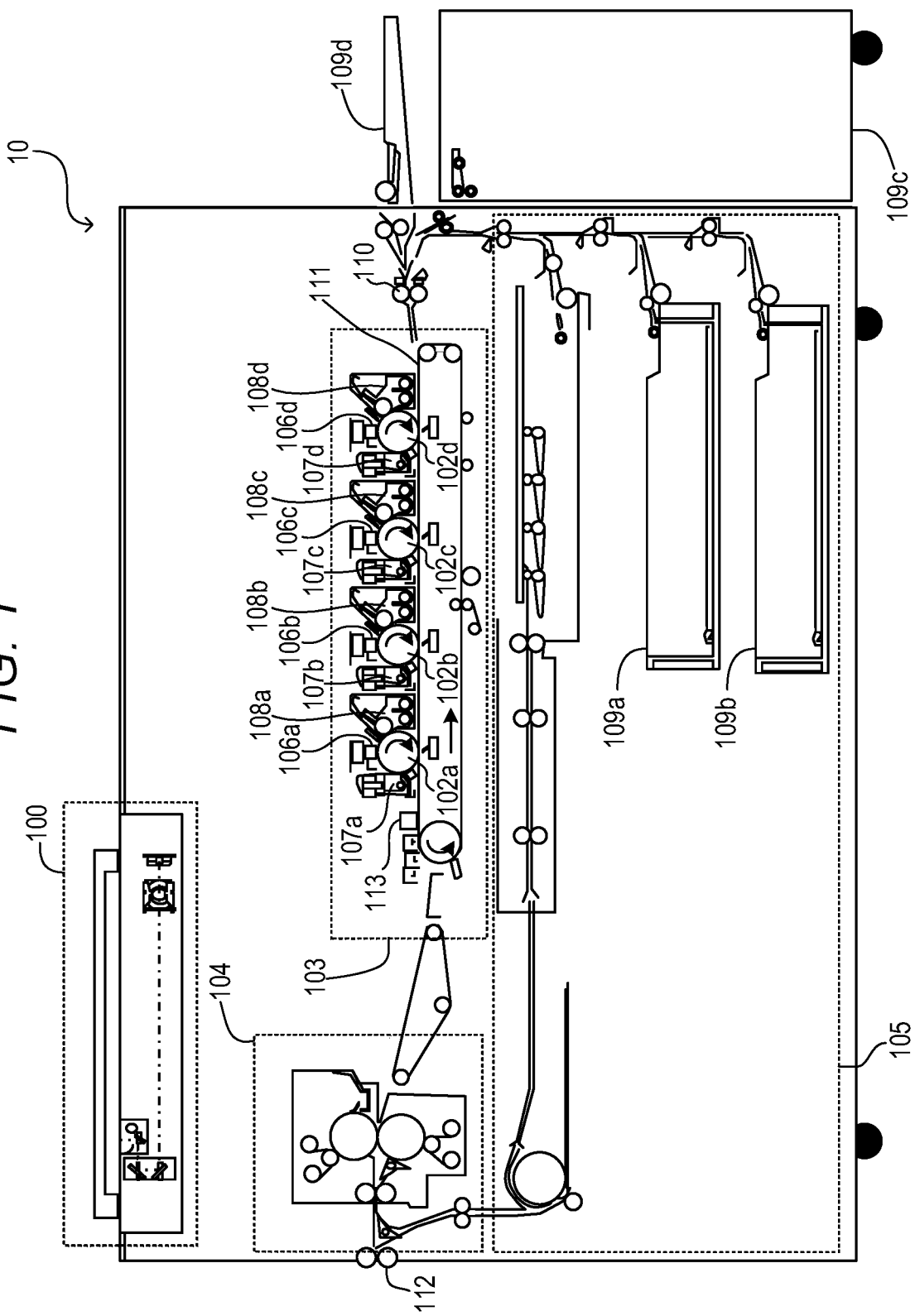
FIG. 1 is a schematic cross-sectional view for illustrating a configuration of an image forming apparatus according to each of first to fourth embodiments of the present invention.

Referring to the drawings, embodiments of the present invention will be described below in detail.

First Embodiment

[Configuration of Image Forming Apparatus]

FIG. 1 is a schematic cross-sectional view for illustrating a configuration of an electrophotographic image forming apparatus 10 according to a first embodiment of the present invention. The image forming apparatus 10 illustrated in FIG. 1 is a multi-functional printer (MFP) having a scanning function and a printing function, and includes a scanner portion 100, an image forming portion 103, a fixing portion 104, a paper feeding/conveying portion 105, and a printer controller (not shown) configured to control those portions. The scanner portion 100 illuminates an original placed on an original table with light to optically read an original image, and converts the read image to an electrical signal to produce image data.

The image forming portion 103 includes a series of four image forming stations arranged in the color order of cyan (C), magenta (M), yellow (Y), and black (K) along a direction (counterclockwise direction) of rotation of an endless conveying belt 111. Each of the four image forming stations has the same configuration, and includes a photosensitive drum 102 serving as a photosensitive member configured to rotate in a direction of the arrow (clockwise direction), an exposure head 106, a charging device 107, and a developing device 108. Suffixes "a", "b", "c", and "d" following the reference numerals 102, 106, 107, and 108 of the photosensitive drum 102, the exposure head 106, the charging device 107, and the developing device 108 represent respective configurations corresponding to black (K), yellow (Y), magenta (M), and cyan (C) associated with the image forming stations. In the following, the suffixes of the reference numerals are omitted except when a specific photosensitive drum or the like is to be specified by the suffix.

In the image forming portion 103, the photosensitive drum 102 is driven to rotate and charged by the charging device 107 to a predetermined potential. The exposure head 106 serving as an exposure portion causes an LED array, in which LEDs are arranged, to emit light based on image data, and causes a rod lens array to focus emitted light from chip surfaces of the LED array onto the photosensitive drum 102 (onto the photosensitive member) to form an electrostatic latent image. The developing device 108 develops the electrostatic latent image formed on the photosensitive drum 102 with a toner. Then, the developed toner image is transferred onto recording paper on the conveying belt 111 configured to convey the recording paper. Such a sequential electrophotographic process is performed in each of the image forming stations. During image formation, after a lapse of a predetermined time period from the initiation of the image formation in the cyan (C) image forming station, respective image forming operations are performed in succession in the magenta (M), yellow (Y), and black (K) image forming stations.

The image forming apparatus 10 illustrated in FIG. 1 includes, as units configured to feed the recording paper, main-body paper feeding units 109a and 109b included in the paper feeding/conveying portion 105, an external paper feeding unit 109c, which is a large-capacity paper feeding unit, and a manual paper feeding unit 109d. During the image formation, the recording paper is fed from one of the feeding units that is specified in advance, and the fed recording paper is conveyed to registration rollers 110. The registration rollers 110 convey the recording paper onto the conveying belt 111 at a time when the toner images formed in the image forming portion 103 described above are transferred onto the recording paper. Onto the recording paper conveyed by the conveying belt 111, the toner images formed on the photosensitive drums 102 of the individual image forming stations are sequentially transferred. The recording paper on which the unfixed toner images are transferred is conveyed to the fixing portion 104. The fixing portion 104 has an internal heat source, for example, a halogen heater, and applies heat and pressure to the toner images on the recording paper with two rollers to fix the toner images onto the recording paper. The recording paper having the toner images fixed thereon by the fixing portion 104 is discharged by discharge rollers 112 to the outside of the image forming apparatus 10.

On a downstream side of the black (K) image forming station in a direction of conveyance of the recording paper, an optical sensor 113 serving as a second sensing unit is disposed at a position facing the conveying belt 111. The optical sensor 113 detects a position of a test image formed on the conveying belt 111 to determine an amount of color shift between the toner images from the individual image forming stations. The amount of color shift determined by the optical sensor 113 is reported to a CPU 400 (see FIG. 4) of a control substrate 415 described later, and the positions of the images in the individual colors are corrected to allow a full-color toner image free from color shift to be transferred onto the recording paper. The printer controller (not shown) performs an image forming operation based on an instruction from an MFP controller (not shown) configured to control the entire multi-functional printer (MFP), while controlling the scanner portion 100, the image forming portion 103, the fixing portion 104, the paper feeding/conveying portion 105, and other portions.

As an example of the electrophotographic image forming apparatus 10, the image forming apparatus 10 of the type configured to transfer the toner images formed on the photosensitive drums 102 in the individual image forming stations directly onto the recording paper on the conveying belt 111 has been described above. However, the present invention is not limited to such a printer of the type configured to transfer the toner images on the photosensitive drums 102 directly onto the recording paper. The present invention is also applicable to an image forming apparatus including, for example, a primary transfer portion configured to transfer the toner images on the photosensitive drums 102 onto an intermediate transfer belt and a secondary transfer portion configured to transfer the toner images on the intermediate transfer belt onto the recording paper.

[Configuration of Exposure Head]

Figure 2A:
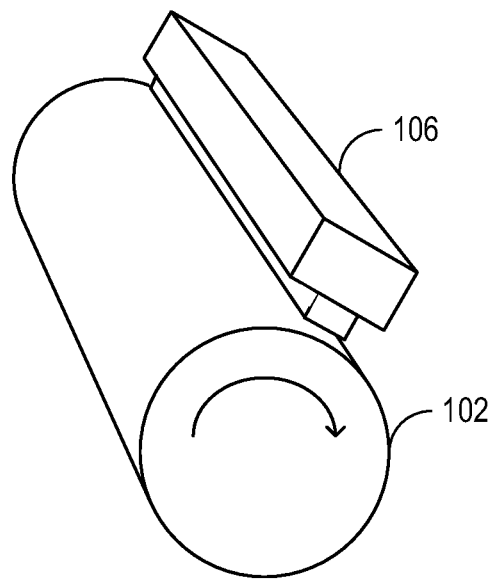
FIG. 2A is a view for illustrating a positional relationship between an exposure head and a photosensitive drum in each of the first to fourth embodiments.
Figure 2B:
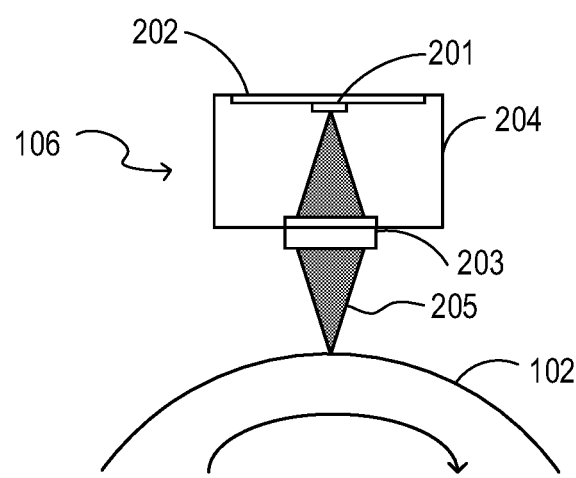
FIG. 2B is a view for illustrating a configuration of the exposure head.

Next, each of the exposure heads 106 configured to perform exposure on the corresponding photosensitive drum 102 is described with reference to FIG. 2A and FIG. 2B. FIG. 2A is a perspective view for illustrating a positional relationship between the exposure head 106 and the photosensitive drum 102. FIG. 2B is a view for illustrating an inner configuration of the exposure head 106 and focusing of a light flux from the exposure head 106 by a rod lens array 203 onto the photosensitive drum 102. As illustrated in FIG. 2A, the exposure head 106 is attached to the image forming apparatus 10 through use of an attachment member (not shown) to be located at a position above and facing the photosensitive drum 102 rotating in a direction of the arrow (FIG. 1).

As illustrated in FIG. 2B, the exposure head 106 includes a drive substrate 202, a surface emitting element array element group 201 mounted on the drive substrate 202, the rod lens array 203, and a housing 204. To the housing 204, the rod lens array 203 and the drive substrate 202 are attached. The rod lens array 203 focuses the light flux from the surface emitting element array element group 201 onto the photosensitive drum 102. In a factory, the exposure head 106 is solely subjected to assembly and adjustment work and, for each of spots, focus adjustment and light amount adjustment is performed. In this case, the assembly and adjustment are performed such that each of a distance between the photosensitive drum 102 and the rod lens array 203 and a distance between the rod lens array 203 and the surface emitting element array element group 201 is a predetermined interval. As a result, light from the surface emitting element array element group 201 is focused on the photosensitive drum 102. Accordingly, during the focus adjustment in the factory, a position at which the rod lens array 203 is attached is adjusted such that the distance between the rod lens array 203 and the surface emitting element array element group 201 has a predetermined value.

[Configuration of Surface Emitting Element Array Element Group]

Figure 3A:
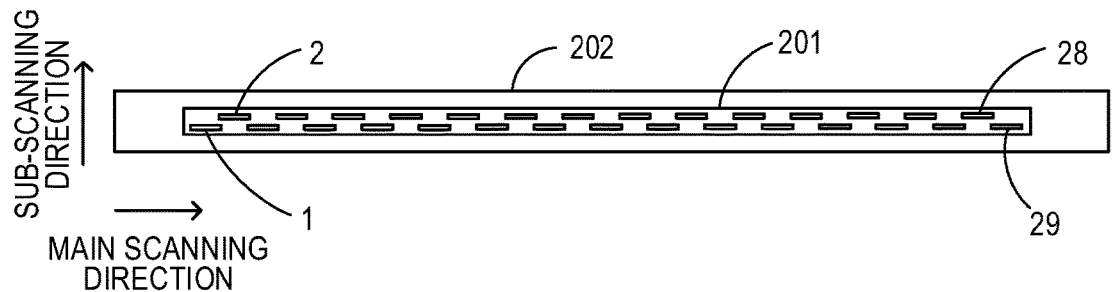
FIG. 3A and FIG. 3B are schematic diagrams of a drive substrate in each of the first to fourth embodiments.
Figure 3B:
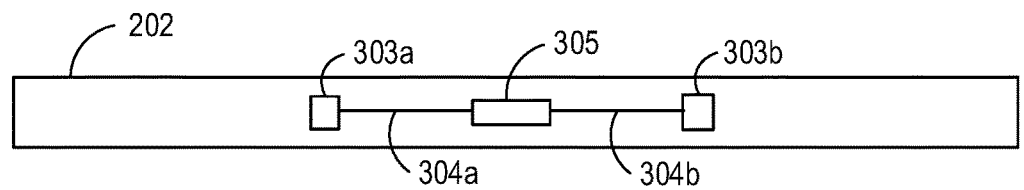

FIG. 3A and FIG. 3B are views for illustrating the surface emitting element array element group 201. FIG. 3A is a schematic diagram for illustrating a configuration of a surface of the drive substrate 202 on which the surface emitting element array element group 201 is mounted. FIG. 3B is a schematic diagram for illustrating a configuration of a surface (second surface) of the drive substrate 202 opposite to the surface (first surface) thereof on which the surface emitting element array element group 201 is mounted.

As illustrated in FIG. 3A, the surface emitting element array element group 201 mounted on the drive substrate 202 has a configuration in which 29 surface emitting element array chips 1 to 29 are arranged in two rows in a staggered configuration along a longitudinal direction of the drive substrate 202. In FIG. 3A, the vertical direction indicates a sub-scanning direction (direction of rotation of the photosensitive drum 102) being a first direction, and the horizontal direction indicates a main scanning direction (longitudinal direction of the exposure head 106) being a second direction perpendicular to the sub-scanning direction. In each of the surface emitting element array chips, individual elements of the surface emitting element array chip having the total of 516 luminous points are arranged with a predetermined resolution pitch in a longitudinal direction of the surface emitting element array chip. In the first embodiment, the pitch of the individual elements of the surface emitting element array chip is approximately 21.16 μm (≈2.54 cm/1, 200 dots) corresponding to a pitch at a resolution of 1,200 dpi being a first resolution. As a result, an end-to-end distance between two of the 516 luminous points that are located at both ends in one surface emitting element array chip is about 10.9 mm (≈21.16 μm×516). The surface emitting element array element group 201 includes the 29 surface emitting element array chips. The number of the light emitting elements that can be exposed in the surface emitting element array element group 201 is 14,964 (=516 elements×29 chips), which allows for image formation corresponding to an image width of about 316 mm (≈about 10.9 mm×29 chips) in the main scanning direction.

Figure 3C:
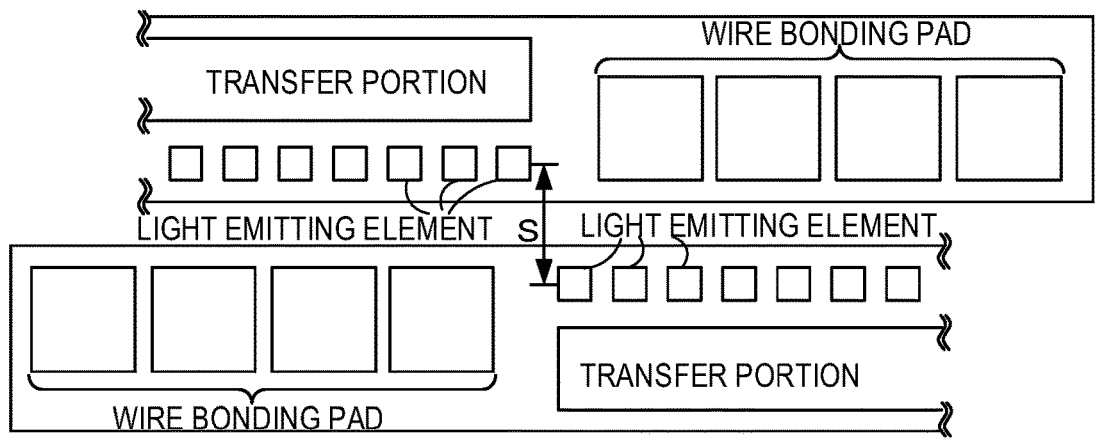
FIG. 3C is a diagram for illustrating a configuration of surface emitting element array chips.

FIG. 3C is a diagram for illustrating an inter-chip boundary portion between the surface emitting element array chips arranged in the two rows in the longitudinal direction. The horizontal direction in FIG. 3C corresponds to the longitudinal direction of the surface emitting element array element group 201 in FIG. 3A. As illustrated in FIG. 3C, on an end portion of each of the surface emitting element array chips, wire bonding pads, to which a control signal is to be input, are disposed. The signal input to the wire bonding pads drives a transfer portion and the light emitting elements. Each of the surface emitting element array chips includes the plurality of light emitting elements. In the boundary portion between the surface emitting element array chips also, the pitch of the light emitting elements in the longitudinal direction (distance between the respective center points of the two light emitting elements) is approximately 21.16 μm corresponding to a pitch at the resolution of 1,200 dpi. The light emitting element array chips arranged in the upper and lower two rows are disposed such that a distance (represented by an arrow S in FIG. 3C) between the respective luminous points in the upper and lower surface emitting element array chips is about 84 μm (a distance corresponding to an integral multiple of a pitch at each resolution, which corresponds to four pixels at 1,200 dpi and to eight pixels at 2,400 dpi).

Further, as illustrated in FIG. 3B, on the surface of the drive substrate 202 opposite to the surface thereof on which the surface emitting element array element group 201 is mounted, drive portions 303a and 303b and a connector 305 are mounted. The drive portions 303a and 303b disposed on both sides of the connector 305 are driver ICs configured to drive the surface emitting element array chips 1 to 15 and the surface emitting element array chips 16 to 29, respectively. The drive portions 303a and 303b are connected to the connector 305 via patterns 304a and 304b, respectively. The connector 305 is connected to signal lines for signals transmitted from the control substrate 415 (see FIG. 4) described later to control the respective drive portions 303a and 303b, to a power supply, and to the ground, while being connected to the drive portions 303a and 303b. From the drive portions 303a and 303b, respective wires for driving the surface emitting element array element group 201 extend through an inner layer of the drive substrate 202 to be connected to the surface emitting element array chips 1 to 15 and to the surface emitting element array chips 16 to 29.

[Control Substrate and Configuration for Controlling Drive Substrate]

Figure 4:
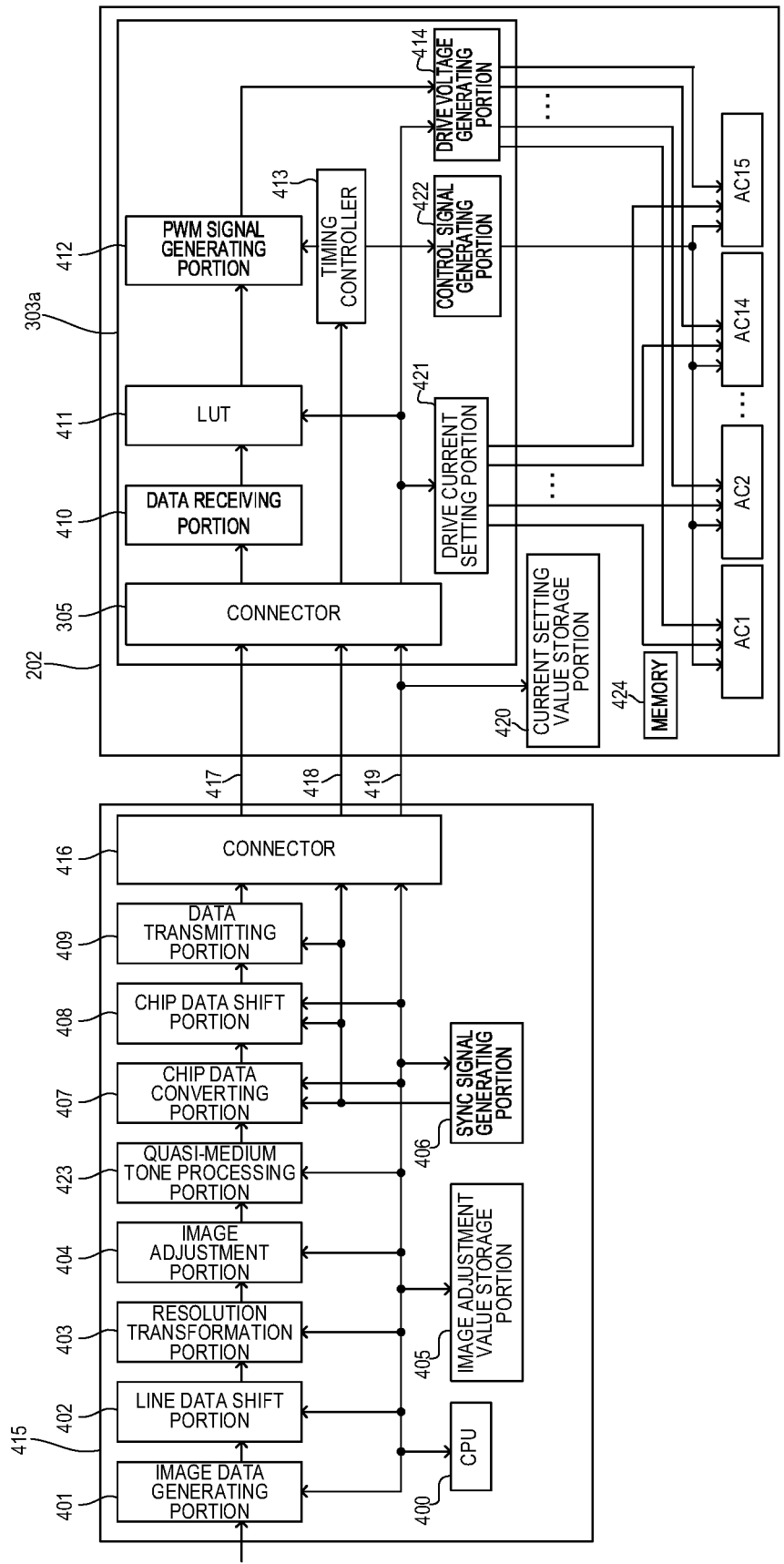
FIG. 4 is a control block diagram of a control substrate and the drive substrate in each of the first to fourth embodiments.

FIG. 4 is a control block diagram of the control substrate 415 configured to process the image data and output the image data to the drive substrate 202 of the exposure head 106 and the drive substrate 202 of the exposure head 106 configured to expose the photosensitive drum 102 based on the image data input from the control substrate 415. The drive substrate 202 is described in association with the surface emitting element array chips ("AC" in FIG. 4) 1 to 15 to be controlled by the drive portion 303a illustrated in FIG. 4. The surface emitting element array chips 16 to 29 to be controlled by the drive portion 303b (not shown in FIG. 4) also perform the same operations as those performed by the surface emitting element array chips 1 to 15 to be controlled by the drive portion 303a. For simpler and easier description, image processing for one color is described herein, but, in the image forming apparatus 10 of the first embodiment, the same processing is simultaneously performed for each of the four colors as parallel processing. The control substrate 415 illustrated in FIG. 4 has a connector 416 for transmitting a signal for controlling the exposure head 106 to the drive substrate 202. From the connector 416, image data, a line synchronization signal described later, and a control signal from the CPU 400 of the control substrate 415 are transmitted via cables 417, 418, and 419, respectively, connected to the connector 305 of the drive substrate 202.

[Configuration of Control Substrate]

In the control substrate 415 serving as a controller, the CPU 400 performs processing of the image data and processing of printing timing. The control substrate 415 includes functional blocks including an image data generating portion 401, a line data shift portion 402, a resolution transformation portion 403, an image adjustment portion 404, a quasi-medium tone processing portion 423, a chip data converting portion 407, a chip data shift portion 408, and a data transmitting portion 409. The control substrate 415 further includes functional blocks including an image adjustment value storage portion 405 and a synchronization signal (sync signal) generating portion 406. In the following, processing in each of the functional blocks in the order is described in which the image data is processed in the control substrate 415.

(Image Data Generating Portion)

The image data generating portion 401 serving as a generating unit performs, on input image data received from the scanner portion 100 or from an external computer connected to the image forming apparatus 10, a dithering process at a resolution specified by the CPU 400 to generate the image data. In the first embodiment, it is assumed that the image data generating portion 401 performs the dithering process at a resolution of 2,400 dpi equivalent to a second resolution. In other words, the image data generated by the image data generating portion 401 is pixel data equivalent to 2,400 dpi. The pixel data equivalent to 2,400 dpi in the first embodiment is assumed to be one-bit data, but it is also possible to represent one pixel in a plurality of bits. The pixel data generated by the image data generating portion 401 is line data corresponding to a line equivalent to 2,400 dpi in the sub-scanning direction (which is also the direction of rotation of the photosensitive drum 102 and the direction of conveyance of the recording paper). The image data generating portion 401 generates the pixel data corresponding to each of pixels equivalent to the resolution of 2,400 dpi in association with a position of the pixel in the main scanning direction (longitudinal direction of the exposure head 106).

(Line Data Shift Portion)

The CPU 400 determines respective amounts of image shift in the main scanning direction and the sub-scanning direction in units of 2,400 dpi based on the amounts of color shift sensed by the optical sensor 113. The amounts of image shift are determined by the CPU 400 based on, for example, relative amounts of color shift from one color to another, which are calculated based on the result of the sensing of a color shift detection pattern image by the optical sensor 113. Then, the CPU 400 specifies an amount of image shift to the line data shift portion 402 as a shift correction unit. The line data shift portion 402 performs, on the entire image region in one page of the recording paper, a shifting process on the image data (referred to also as "line data") input from the image data generating portion 401 in units of 2,400 dpi based on the amount of image shift specified by the CPU 400. By the shifting process, a position at which an image is to be formed is corrected. The line data shift portion 402 may also divide the image region in one page of the recording paper into a plurality of image regions and perform the shifting process on each of the plurality of image regions resulting from the division.

(Resolution Transformation Portion)

Figure 5:
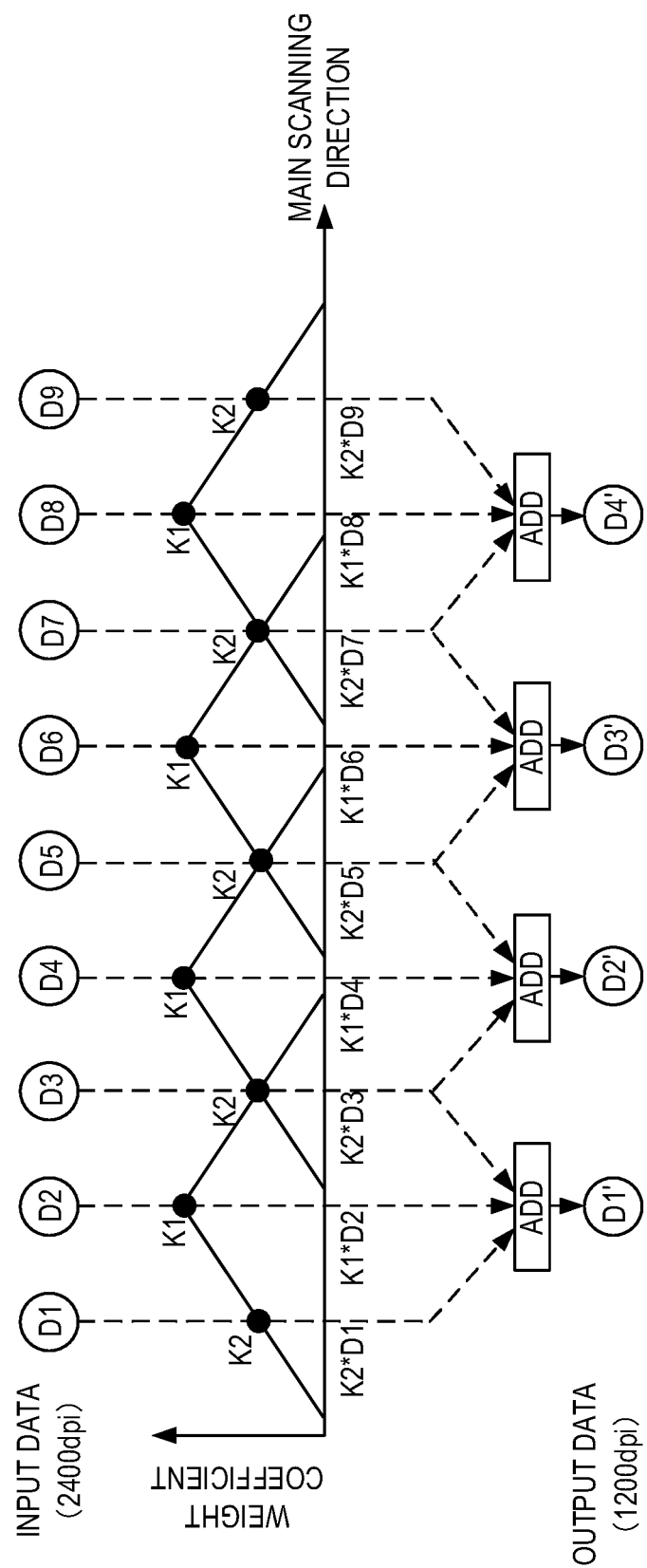
FIG. 5 is a diagram for illustrating a filtering process in each of the first to fourth embodiments.

The resolution transformation portion 403 serving as a transformation unit performs, on the image data output from the line data shift portion 402, an interpolation process based on the filtering process in the main scanning direction and transforms the resolution in the main scanning direction from 2,400 dpi to 1,200 dpi. FIG. 5 is a diagram for illustrating the filtering process being performed in the resolution transformation portion 403. In FIG. 5, D1 to D9 represent image data items (input data items at 2,400 dpi) for the surface emitting element array chip. The image data items D1 to D8 are the image data items for the corresponding one of the surface emitting element array chips, while the image data item D9 is a pixel data item for an outermost end portion of the adjacent surface emitting element array chip. In FIG. 5, D1' to D4' represent image data items (output data items at 1,200 dpi) after the filtering process is performed by the resolution transformation portion 403. The resolution (1,200 dpi) of each of the output data items is one half of the resolution (2,400 dpi) of each of the input data items. The image data for each of the pixels has a value given by Expression (1) given below:

$$Dn' = D(2 \times n - 1) \times K2 + D(2 \times n) \times K1 + D(2 \times n + 1) \times K2 \qquad (1)$$

In Expression (1), "n" corresponds to 516, which is the number of the surface emitting elements in each of the surface emitting element array chips and, based on the order in which the light emitting elements are turned ON, an arithmetic operation is sequentially performed for the image data for each of the light emitting elements in the order given by n=1 to 516. Further, K1 serving as a first coefficient represents a weight coefficient for input data corresponding to the same coordinate position as that of the output data in the main scanning direction, and K2 serving as a second coefficient represents a weight coefficient for input data at a coordinate shifted by a ½ pixel from that of the output data in the main scanning direction. In the first embodiment, an interpolation arithmetic operation (filtering process) is performed assuming that K1 and K2 have respective values of 0.5 and 0.25, but it is also possible to use weight coefficients different from those used in the first embodiment. In the first embodiment, by setting the weight coefficient K2 to a value larger than zero, it is possible to reflect, on the output data, the information of the image data generated at a resolution (2,400 dpi) higher than the resolution (1,200 dpi) of the output data. Specifically, in the previous-stage process, the movement of the image position in the main scanning direction is performed at 2,400 dpi. Then, in the subsequent-stage process, the resolution of the image data is transformed to 1,200 dpi in the resolution transformation portion 403 to allow a 1,200 dpi image to be generated, while allowing the accuracy of the image movement in units of 2,400 dpi to be maintained.

(Image Adjustment Portion, Image Adjustment Value Storage Portion, and Quasi-Medium Tone Processing Portion)

The image adjustment portion 404 serving as a light amount adjustment unit adjusts the image data serving as image information based on image adjustment values stored in the image adjustment value storage portion 405 to correct the amount of light emitted from each of the surface emitting elements. The details of the image data adjustment are described later. The image adjustment value storage portion 405 serving as a storage portion stores the image adjustment values for image processing to be performed in the image adjustment portion 404. The details of the image adjustment values are described later. The quasi-medium tone processing portion 423 serving as a medium tone processing unit performs, on the image data subjected to the light amount correction in the image adjustment portion 404, an error diffusion process, in which the number of tones is reduced from 256 (eight bits) to 8 (three bits) by error diffusion. The details of the error diffusion process are described later.

(Synchronization Signal Generating Portion)

The synchronization signal generating portion 406 generates a cycle time signal (hereinafter referred to as "line synchronization signal"), which is synchronous with a rotating speed of the photosensitive drum 102 and corresponds to one line in the direction of rotation of the photosensitive drum 102. The CPU 400 specifies, to the synchronization signal generating portion 406, the cycle time of the line synchronization signal, that is, a time period required by the surface of the photosensitive drum 102 to move by a pixel size (about 10.5 μm) at 2,400 dpi in the direction of rotation of the photosensitive drum 102 (in the sub-scanning direction) at the rotating speed of the photosensitive drum 102 determined in advance. For example, when printing is performed at a speed of 200 m/second in the sub-scanning direction, the CPU 400 determines that the cycle time (cycle time corresponding to one line in the sub-scanning direction) of the line synchronization signal is about 52.9 is ($\approx$(25.4 mm/2,400 dots)/200 mm) and specifies the cycle time to the synchronization signal generating portion 406. When the image forming apparatus 10 has a sensing portion for sensing the rotating speed of the photosensitive drum 102, the CPU 400 calculates the rotating speed of the photosensitive drum 102 in the sub-scanning direction based on a result of sensing (a generation cycle time of a signal output from an encoder) by the sensing portion. Then, the CPU 400 determines the cycle time of the line synchronization signal based on the result of the calculation. For example, the sensing portion mentioned herein is an encoder disposed on a rotation shaft of the photosensitive drum. Meanwhile, when the image forming apparatus 10 does not have a sensing portion configured to sense the rotation speed of the photosensitive drum 102, the CPU 400 calculates the rotation speed of the photosensitive drum 102 based on information as given below. Specifically, the CPU 400 determines the cycle time of the line synchronization signal based on information on the type of paper such as an amount by basis weight ($g/cm^2$) or sheet size of a sheet input by a user via an operating portion.

(Chip Data Converting Portion)

The chip data converting portion 407 reads out, in synchronization with the line synchronization signal, line data for each one line in the sub-scanning direction of the photosensitive drum 102 from the quasi-medium tone processing portion 423 on a line-by-line basis. Then, the chip data converting portion 407 performs data processing in which the read line data is divided into line data items corresponding to the individual chips.

Figure 6A:
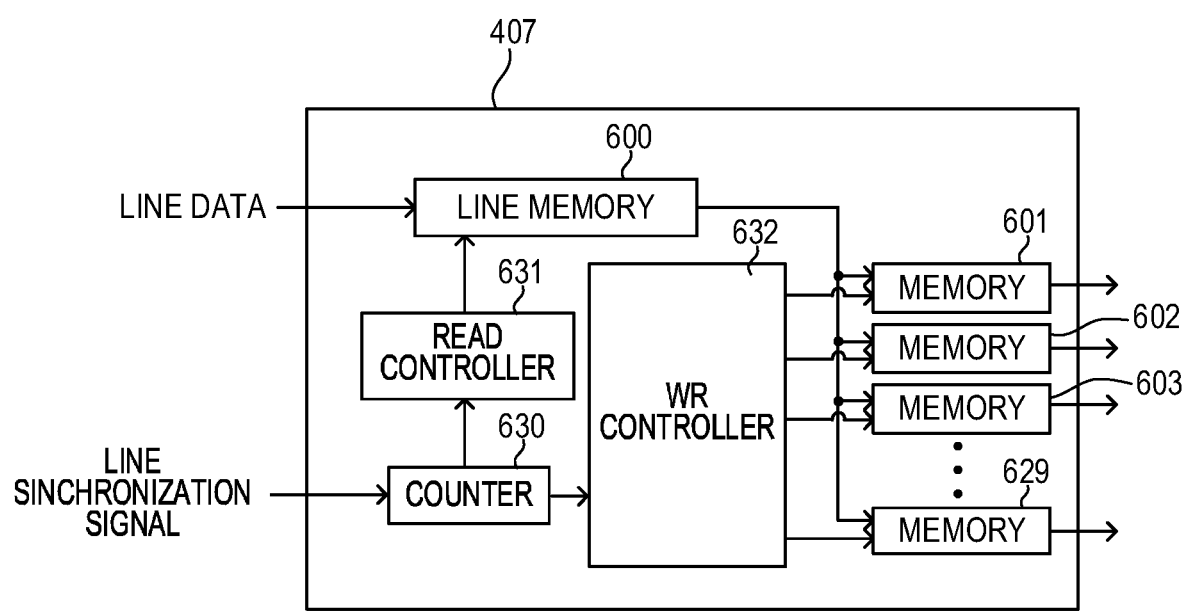
FIG. 6A is a control block diagram of a chip data converting portion in each of the first to fourth embodiments.

FIG. 6A is a block diagram for illustrating a configuration of the chip data converting portion 407. In FIG. 6A, the line synchronization signal output from the synchronization signal generating portion 406 is input to a counter 630. The counter 630 includes a frequency modulation circuit configured to modulate the input line synchronization signal to generate a CLK signal at a frequency higher than that of the line synchronization signal. The counter 630 may also include, instead of the frequency modulation circuit, an embedded oscillating device configured to generate a clock signal (CLK) at a frequency higher than that of the line synchronization signal. In the following, by way of example, description is given of a configuration in which the chip data converting portion 407 reads out the line data from the quasi-medium tone processing portion 423, but the embodiment is not limited thereto. Specifically, it is also possible to use a configuration in which the line synchronization signal is supplied to the quasi-medium tone processing portion 423, and the quasi-medium tone processing portion 423 generates a clock signal therein and voluntarily transmits the line data to the chip data converting portion 407.

When the line synchronization signal is input to the counter 630, the counter 630 resets a count value to 0 and then increments the count value in synchronization with the pulse number of the CLK (clock) signal (see FIG. 6B). The frequency of the CLK signal generated from the counter 630 is determined at a design stage based on a size (number of bits) of the pixel data to be read out by the chip data converting portion 407 in one cycle time of the line synchronization signal and on a data processing speed of the chip data converting portion 407 described later. For example, as described above, the surface emitting element array element group 201 includes 14,964 light emitting elements (calculated at 1,200 dpi) configured to expose one line in the sub-scanning direction.

The chip data converting portion 407 performs, between the line synchronization signals, the reading out of the line data corresponding to one line in the sub-scanning direction and the writing of the line data into a line memory 600 described later, while performing the writing of the image data into memories 601 to 629 described later. Accordingly, the counter 630 performs an operation of counting a number (29,928) corresponding to double the number (14,964) of pixels included in the line data corresponding to one line. It is assumed that a period during which the count value of the counter 630 is from 1 to 14,964 is represented by "Tm1", and a period during which the count value is from 14,965 to 29,928 is represented by "Tm2" (see FIG. 6B). A read controller 631 reads the line data from the quasi-medium tone processing portion 423 based on the count value of the counter 630. Specifically, during the period Tm1, during which the count value of the counter 630 is from 1 to 14,964, the read controller 631 stores, in the line memory 600, the line data (14,964 pixels) corresponding to one line in the main scanning direction. During the period Tm2, during which the count value of the counter 630 is from 14,965 to 29,928, a WR controller 632 divides the line data corresponding to one line in the sub-scanning direction, which is stored in the line memory 600, and writes the divided line data into the memories 601 to 629. Each of the memories 601 to 629 has a storage capacity smaller than that of the line memory 600 and store the line data divided for the individual chips (divided line data) on a per-chip basis. The memories 601 to 629 are first-in, first-out (FIFO) memories provided to correspond to the surface emitting element array chips 1 to 29. Specifically, the memory 601 stores the line data corresponding to the surface emitting element array chip 1, the memory 602 stores the line data corresponding to the surface emitting element array chip 2, . . . , and the memory 629 stores the line data corresponding to the surface emitting element array chip 29.

Subsequently, the writing of the line data read out from the quasi-medium tone processing portion 423 into the memories 601 to 629 and the outputting of the image data written into the memories 601 to 629, which are performed by the chip data converting portion 407, are described. FIG. 6B is a time chart for illustrating respective times when the line data is input and output in the chip data converting portion 407. In FIG. 6B, the line synchronization signal represents a pulse signal output from the synchronization signal generating portion 406, while TL1, TL2, . . . , TL10 represent numbers assigned to cycle times each corresponding to one line in the sub-scanning direction. One cycle time of the line synchronization signal is divided into the period Tm1 and the period Tm2 based on the counter value of the counter 630. Input data to the line memory 600 represents the image data from the quasi-medium tone processing portion 423, which is input from the quasi-medium tone processing portion 423 during the period Tm1 of each of the cycle times TL1, TL2, . . . , TL10. First line data in FIG. 6B indicates the line data item corresponding to a first line in the sub-scanning direction (corresponding to one line in the main scanning direction). Likewise, second line data, . . . , tenth line data indicate the line data items corresponding to a second line in the sub-scanning direction, . . . , the line data item corresponding to a tenth line in the sub-scanning direction (each corresponding to one line in the main scanning direction).

Further, "INPUT DATA TO MEMORY 601" illustrated in FIG. 6B indicates a time when a line data item that is among the line data items each corresponding to one line in the main scanning direction and stored in the line memory 600 and that corresponds to the surface emitting element array chip 1 is written into the memory 601. Likewise, "INPUT DATA TO MEMORY 602", "INPUT DATA TO MEMORY 603", . . . , "INPUT DATA TO MEMORY 629" indicate respective times when line data items corresponding to the individual surface emitting element array chips 2, 3, . . . , 29 are written into the memories 602, 603, . . . , 629. The first-line data in the input data to the memory 601 does not indicate all the line data items each corresponding to one line in the main scanning direction, but indicates the line data item (divided line data item) in the main scanning direction to which the surface emitting element array chip 1 corresponds. The same applies also to the input data items to the memories 602 to 629.

Meanwhile, "OUTPUT DATA FROM MEMORY 601" illustrated in FIG. 6B indicates a time when the line data item written into the memory 601 is read out to be output to the surface emitting element array chip 1. Likewise, "OUTPUT DATA FROM MEMORY 602", . . . , "OUTPUT DATA FROM MEMORY 629" each illustrated in FIG. 6B indicate respective times when the line data items written into the memories 602, . . . , 629 are read out to be output to the surface emitting element array chips 2, . . . , 29. The first-line data in the output data from the memory 601 does not indicate all the line data items each corresponding to one line in the main scanning direction, but indicates the line data item (divided line data item) in the main scanning direction to which the surface emitting element array chip 1 corresponds. The same applies also to the output data from the memories 602 to 629.

In the first embodiment, from the line memory 600, the line data items each corresponding to one line in the main scanning direction are sequentially read out, and the line data item is first written into the memory 601 for storing the line data item corresponding to the surface emitting element array chip 1. Then, the line data item is written into the memory 602 for storing the image data item corresponding to the surface emitting element array chip 2, and subsequently, the line data items are continuously written sequentially into the memories 603 to 629 for storing the image data items corresponding to the surface emitting element array chips 3 to 29. In the chip data shift portion 408 in a stage subsequent to that of the chip data converting portion 407, a data shifting process in the sub-scanning direction is performed individually for each of the surface emitting element array chips. Accordingly, it is assumed that, in the memories 601 to 629, the line data items corresponding to ten lines in the sub-scanning direction are stored.

(Chip Data Shift Portion)

The chip data shift portion 408 serving as a shift correction unit performs the following control. Specifically, based on data (at the resolution of 2,400 dpi) related to an amount of image shift in the sub-scanning direction for each of the surface emitting element array chips, which is specified in advance by the CPU 400, relative timing to read out the line data item from each of the memories 601 to 629 is controlled. In the following, an image shifting process in the sub-scanning direction, which is performed by the chip data shift portion 408, is specifically described.

It is desired that, in the longitudinal direction of the exposure head 106, there be no shift of the position at which each of the even-numbered surface emitting element array chips is mounted. Likewise, it is also preferred that, in the longitudinal direction of the exposure head 106, there be no shift of the position at which each of the odd-numbered surface emitting element array chips is mounted. It is also preferred in terms of design that, in the sub-scanning direction, the position at which each of the even-numbered surface emitting element array chips is mounted and the position at which each of the odd-numbered surface emitting element array chips is mounted be shifted from each other by a predetermined number of pixels (for example, eight pixels) at 2,400 dpi. It is also preferred that a position at which a row of the light emitting elements is disposed in the sub-scanning direction not vary from one surface emitting element array chip to another and be fixed in each of the surface emitting element array chips. However, the positions at which the surface emitting element array chips are mounted and the position at which the row of the light emitting elements is disposed include errors, and such errors may possibly degrade the image quality of an output image.

A memory 424 (ROM) illustrated in FIG. 4 stores therein correction data calculated from a relative positional relationship between the individual rows of the light emitting elements in the sub-scanning direction in the surface emitting element array chips 1 to 29, which are mounted in the staggered configuration on the drive substrate 202. For example, the memory 424 stores therein the correction data based on measurement data as given below. The correction data stored in the memory 424 indicates the number of pixels at 2,400 dpi by which each of the rows of the light emitting elements in the surface emitting element array chips 2 to 29 other than the surface emitting element array chip 1 is shifted in the sub-scanning direction from the row of the light emitting elements in the surface emitting element array chip 1 serving as a basis for a position in the sub-scanning direction. The measurement data is obtained as follows. After the surface emitting element array chips 2 to 29 are mounted on the drive substrate 202, a measurement device turns ON the light emitting elements in each of the surface emitting element array chips and performs measurement based on the result of receiving light. The CPU 400 sets, in an internal register of the chip data shift portion 408, the correction data read out from the memory 424 in response to the turning ON of a power supply of the image forming apparatus 10. The chip data shift portion 408 performs a shifting process on the line data items each for forming the same line stored in the memories 601 to 629 based on the correction data set in the internal register. For example, when the row of the light emitting elements in the surface emitting element array chip 2, which is mounted on the drive substrate, is shifted by eight pixels at 2,400 dpi from the row of the light emitting elements in the surface emitting element array chip 1 in the sub-scanning direction, the chip data shift portion 408 performs the following process. Specifically, the chip data shift portion 408 delays, from a time when each of the line data items corresponding to the surface emitting element array chip 1 is output to the drive substrate 202, a time when each of the line data items corresponding to the surface emitting element array chip 2, which is for forming the same line, is output to the drive substrate 202 by eight pixels. Consequently, the chip data shift portion 408 shifts all the line data items corresponding to the surface emitting element array chip 2 from the line data items corresponding to the surface emitting element array chip 1.

(Data Transmitting Portion)

The data transmitting portion 409 serving as a transmission unit transmits, to the drive substrate 202 of the exposure head 106, the line data items obtained after data processing is performed on the series of line data items described above. Referring to FIG. 6B described above, timing to transmit each of the line data items is described. As illustrated in FIG. 3A, of the surface emitting element array chips, the odd-numbered surface emitting element array chips 1, 3, 5, ..., 29 are disposed on an upstream side in the sub-scanning direction, and the even-numbered surface emitting element array chips 2, 4, 6, ..., 28 are disposed on a downstream side in the sub-scanning direction. In the time chart illustrated in FIG. 6B, writing of the image data items into the memories 601, 603, ..., 629 corresponding to the odd-numbered surface emitting element array chips 1, 3, ..., 29 is performed during the period (TL1 in FIG. 6B) of the first line synchronization signal. Then, during the subsequent period (TL2 in FIG. 6B) of the line synchronization signal, data items corresponding to the first line in the sub-scanning direction are read out from the memories 601, ..., 629 corresponding to the odd-numbered surface emitting element array chips 1, ..., 29. Likewise, during the period of the subsequent line synchronization signal, data items corresponding to the second line in the sub-scanning direction are read out from the memories 601, ..., 629 corresponding to the odd-numbered surface emitting element array chips 1, ..., 29. Then, during the period (TL10 in FIG. 6B) of the tenth line synchronization signal, from the memories 601, ..., 629 corresponding to the odd-numbered surface emitting element array chips 1, ..., 29, data items corresponding to the ninth line in the sub-scanning direction are read out. From the memory 602 corresponding to the even-numbered surface emitting element array chip 2, the image data item is read out during the period (TL10 in FIG. 6B) subsequent to the period TL1, during which the image data item is written into the memory 602, by nine pulses of the line synchronization signal.

The data transmitting portion 409 transmits the line data items processed by the chip data shift portion 408 to the drive substrate 202. The data transmitting portion 409 includes, instead of an oscillating device, a frequency modulation circuit configured to modulate the line synchronization signal input thereto to generate a clock signal at a frequency higher than that of the line synchronization signal. The data transmitting portion 409 may also include, instead of the frequency modulation circuit, an embedded oscillating device configured to generate a clock signal at a frequency higher than that of the line synchronization signal. The data transmitting portion 409 adjusts respective times when the image data items are read out from the memories corresponding to the odd-numbered and even-numbered surface emitting element array chips in accordance with a distance (corresponding to eight pixels at 2,400 dpi) between the surface emitting element array chips arranged in the two rows in the staggered configuration. In the first embodiment, the frequency of the clock signal (CLK in FIG. 6B) is determined such that the count value is equal to or larger than 29,928 (number that is double the number of pixel data items corresponding to one line) in one cycle time of the line synchronization signal. This allows the inputting (writing) of the image data to the line memory 600 and the outputting (writing) of the image data from the line memory 600 to the memories 601 to 629 to be performed in one cycle time of the line synchronization signal.

Meanwhile, data is read out from the memories 601 to 629 such that, from the 29 memories 601 to 629, the image data items each corresponding to one line in the main scanning direction and corresponding to the individual surface emitting element array chips are output in parallel in one cycle time of the line synchronization signal. Accordingly, the image data items may also be read out from the memories 601 to 629 at a speed lower than a speed at which the image data items are written into the memories. For example, in the first embodiment, it is assumed that the image data items are read out from the memories 601 to 629 in a cycle time that is 58 times longer than the cycle time of the clock signal at the time when the image data items are written into the memories 601 to 629.

[Drive Portion of Exposure Head]

Next, a process to be performed in the drive portion 303a mounted on the drive substrate 202 of the exposure head 106 is described. The drive portion 303a includes functional blocks including a data receiving portion 410, an LUT 411, a PWM signal generating portion 412, a timing controller 413, a control signal generating portion 422, a drive voltage generating portion 414, and a drive current setting portion 421. The drive substrate 202 includes a current setting value storage portion 420 and the memory 424 described above. In the following, processes to be performed in the individual functional blocks are described in the order in which the image data is processed in the drive portion 303a.

(Data Receiving Portion)

The data receiving portion 410 of the drive portion 303a serving as a reception unit receives a signal transmitted from the data transmitting portion 409 of the control substrate 415. It is assumed herein that the data receiving portion 410 and the data transmitting portion 409 receive and transmit the image data (line data) on a per-line basis in synchronization with the line synchronization signal. As described above, in the chip data converting portion 407, the line data items are arranged for the individual surface emitting element array chips 1 to 29, and the subsequent processing blocks are configured to process the line data items for the surface emitting element array chips 1 to 29 in parallel. It is assumed that the drive portion 303a includes a circuit being configured to receive the image data items corresponding to the individual surface emitting element array chips 1 to 15 and being capable of processing the image data items in parallel for the individual surface emitting element array chips.

(LUT)

The LUT 411 serving as a light amount correction unit transforms an image data value (density data value) for each of the pixels corresponding to the light emitting elements in the surface emitting element array chips to light amount value data through use of a look-up table (LUT). The LUT 411 transforms the data value for each of the pixels based on a response characteristic of a light emission time of each of the surface emitting element array chips such that an accumulated light amount at the time when pulsewise light emission is enabled has a predetermined value. For example, when a response of the light emission time of each of the surface emitting element array chips is slow and the accumulated light amount is smaller than a target value, the LUT 411 performs the data transformation so as to increase the data value. In the first embodiment, it is assumed that the CPU 400 sets, before initiation of image formation, values in a transformation table set in the look-up table to predetermined values that are based on the empirically obtained response characteristic of each of the surface emitting element array chips.

(PWM Signal Generating Portion, Timing Controller, Control Signal Generating Portion, and Drive Voltage Generating Portion)

Subsequently, the PWM signal generating portion 412 generates a pulse width signal (hereinafter referred to as "PWM signal") corresponding to the light emission time during which each of the surface emitting element array chips emits light in one pixel interval based on the data value for each of the pixels adjusted in the LUT 411. The timing to output the PWM signal is controlled by the timing controller 413. The timing controller 413 generates a synchronization signal corresponding to the pixel interval of each of the pixels from the line synchronization signal generated from the synchronization signal generating portion 406 of the control substrate 415 and outputs the synchronization signal to the PWM signal generating portion 412. The drive voltage generating portion 414 generates a drive voltage for driving each of the surface emitting element array chips in synchronization with the PWM signal. The drive voltage generating portion 414 has a configuration that allows the CPU 400 to adjust a voltage level of the output signal to around 5 V so as to achieve a predetermined light amount. In the first embodiment, each of the surface emitting element array chips is configured to be able to simultaneously and independently drive the four light emitting elements. The drive voltage generating portion 414 supplies drive signals to four lines for each of the surface emitting element array chips 1 to 15, and the entire drive portion 303a supplies the drive signals to 1 line (15 chips)× 4=60 lines in the staggered configuration. It is assumed that the respective drive signals supplied to the individual surface emitting element array chips are represented by $\Phi W1$ to $\Phi W4$. Meanwhile, by a shift thyristor operation in the first embodiment, the individual surface emitting element array chips are sequentially driven. The control signal generating portion 422 generates, from the synchronization signal corresponding to the pixel interval, which is generated from the timing controller 413, control signals $\Phi_s$, $\Phi 1$, and $\Phi 2$ for transferring a shift thyristor for each of the pixels.

(Current Setting Value Storage Portion and Drive Current Setting Portion)

The current setting value storage portion 420 stores respective current setting values for the individual surface emitting element array chips 1 to 29. The details of the current setting values are described later. The drive current setting portion 421 serving as a light amount control unit sets, based on the current setting values stored in the current setting value storage portion 420, respective drive currents for the individual surface emitting element array chips 1 to 15 of the drive portion 303a. The details of this setting are described later.

[Light Amount Correction]

Next, light amount correction in the first embodiment is described. Similarly to typical semiconductor chips, the plurality of surface emitting element array chips 1 to 29 are manufactured in a wafer and cut into the individual chips. The characteristics of the semiconductor chips thus manufactured depend on the positions at which the semiconductor chips are formed on the wafer. FIG. 7 is a graph for showing the amount of light emitted from each of the surface emitting elements in the surface emitting element array chips (AC in FIG. 7) 1 to 29 mounted on the exposure head 106. In FIG. 7, the vertical axis represents the light amount, while the horizontal axis represents a main scan coordinate, that is, the position of each of the surface emitting elements 0 to 14963 in the surface emitting element array chips 1 to 29. As shown in FIG. 7, $\Delta p1, \Delta p2, \ldots, \Delta p29$ represent variations between the respective amounts of light emitted from the surface emitting elements included in the same surface emitting element array chip and formed at adjacent positions on the wafer. Such variations between light amounts are hereinafter referred to as "light amount variations $\Delta p1, \Delta p2, \ldots, \Delta p29$". Meanwhile, $\Delta P$ represents a variation between the amounts of light emitted from the surface emitting elements in the surface emitting element array chips formed at different positions on the wafer. Such a variation between light amounts is hereinafter referred to as "light amount variation $\Delta P$". The light amount variations $\Delta p1, \Delta p2, \ldots, \Delta p29$ tend to be smaller than the light amount variation ΔP. Accordingly, in the first embodiment, it is assumed that light amount correction between the surface emitting element array chips is performed by drive current adjustment, and light amount correction between the surface emitting elements in each of the surface emitting element array chips is performed by image adjustment.

(Drive Current Adjustment)

Figure 8A:
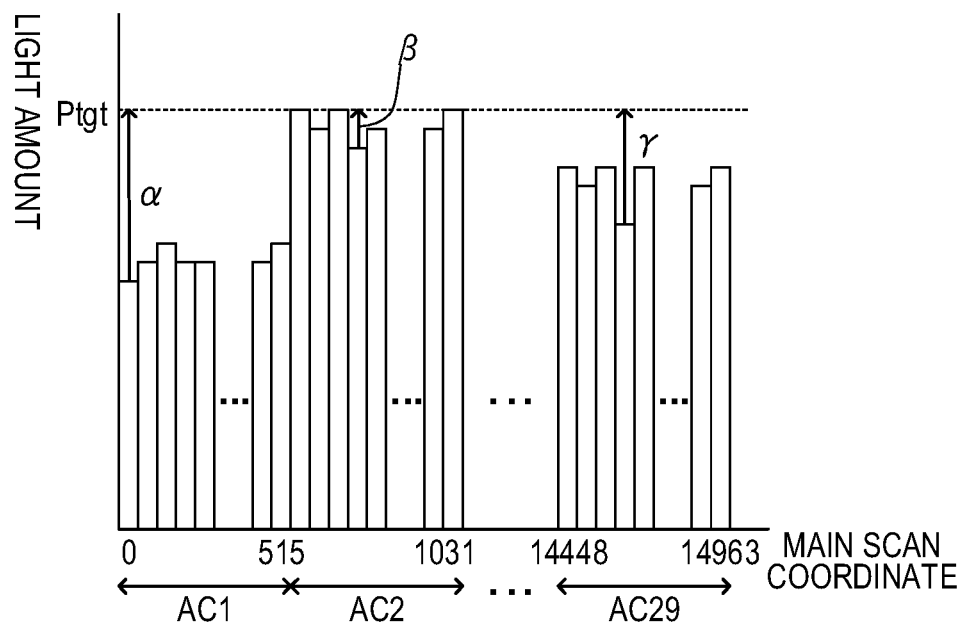
FIG. 8A and FIG. 8B are graphs for showing drive current adjustment in each of the first to fourth embodiments.
Figure 8B:
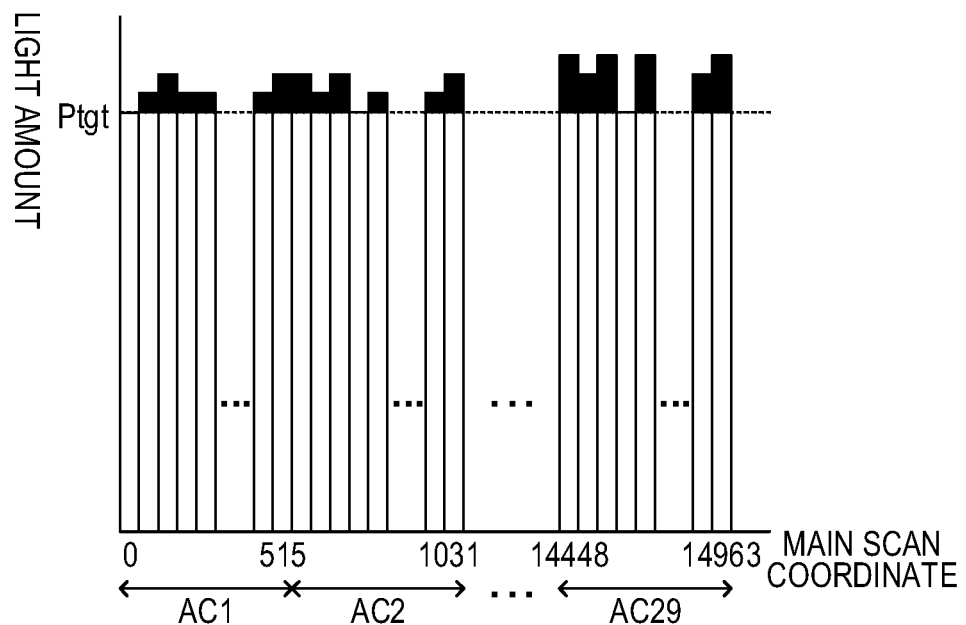

FIG. 8A is a graph for showing the drive current adjustment. FIG. 8A is a graph for showing respective amounts of light emitted from all the surface emitting elements 0 to 14963 in the surface emitting element array chips 1 to 29 of the exposure head 106 when the surface emitting elements are turned ON at the same current setting value that allows the amount of light from each of the surface emitting elements to be equal to a target light amount (target amount of emitted light) Ptgt. In FIG. 8A, the vertical axis represents the light amount, and the horizontal axis represents the main scan coordinate being the coordinate of each of the surface emitting elements (0 to 14963) in the surface emitting element array chips (AC1, AC2, . . . , AC29) in the main scanning direction. As shown in FIG. 8A, even when the surface emitting elements in the surface emitting element array chips (AC) 1 to 29 are caused to emit light at the same current setting value, there are variations between the respective amounts of light emitted therefrom. Accordingly, in the first embodiment, the current setting value is changed such that the amount of light emitted from a surface emitting element that emits the smallest amount of light in each of the surface emitting element array chips 1 to 29 illustrated in FIG. 8A is equal to the target light amount Ptgt. Specifically, in FIG. 8A, the current value is changed such that the amounts of light emitted from the surface emitting elements that emit the smallest amounts of light in the surface emitting element array chips AC1, AC2, . . . , AC29, which are indicated by the vertical arrows in FIG. 8A, are equal to the target light amount Ptgt. For example, in the surface emitting element array chip AC1, the amount of light emitted from the surface emitting element indicated by the arrow α is the smallest, and, in the surface emitting element array chip AC2, the amount of light emitted from the surface emitting element indicated by the arrow β is the smallest. Further, in the surface emitting element array chip AC29, the amount of light emitted from the surface emitting element indicated by the arrow γ is the smallest. FIG. 8B is a graph for showing the result of performing the drive current adjustment for each of the surface emitting element array chips such that the amount of light emitted from the surface emitting element that emits the smallest amount of light in each of the surface emitting element array chips (AC) 1 to 29 is equal to the target light amount Ptgt. For example, in FIG. 8A, in the surface emitting element array chip AC1, the amount of light emitted from the surface emitting element indicated by the arrow α is the smallest. Accordingly, the drive current is adjusted such that the amount of light emitted from the surface emitting element indicated by the arrow α in the surface emitting element array chip AC1 is equal to the target light amount Ptgt. Likewise, in the surface emitting element array chip AC2, the amount of light emitted from the surface emitting element indicated by the arrow β is the smallest, and in the surface emitting element array chip AC 29, the amount of light emitted from the surface emitting element indicated by the arrow γ is the smallest. Accordingly, the drive current is adjusted such that each of the amount of light emitted from the surface emitting element indicated by the arrow β in the surface emitting element array chip AC2 and the amount of light emitted from the surface emitting element indicated by the arrow γ in the surface emitting element array chip AC29 is equal to the target light amount Ptgt. As shown in FIG. 8B, the amount of light emitted from each of the surface emitting elements in the surface emitting element array chips 1 to 29 has a value equal to or larger than the target light amount Ptgt (equal to or larger than the target light amount). Specifically, the amount of light that is the smallest among the amounts of light emitted from the surface emitting elements is equal to the target light amount Ptgt. The amounts of light emitted from the surface emitting elements that are larger than the smallest amount of emitted light exceed the target light amount Ptgt, and the amounts in excess of the target light amount Ptgt correspond to the blacked-out amounts of emitted light.

(Configuration of Drive Current Setting Portion)

Figure 9:
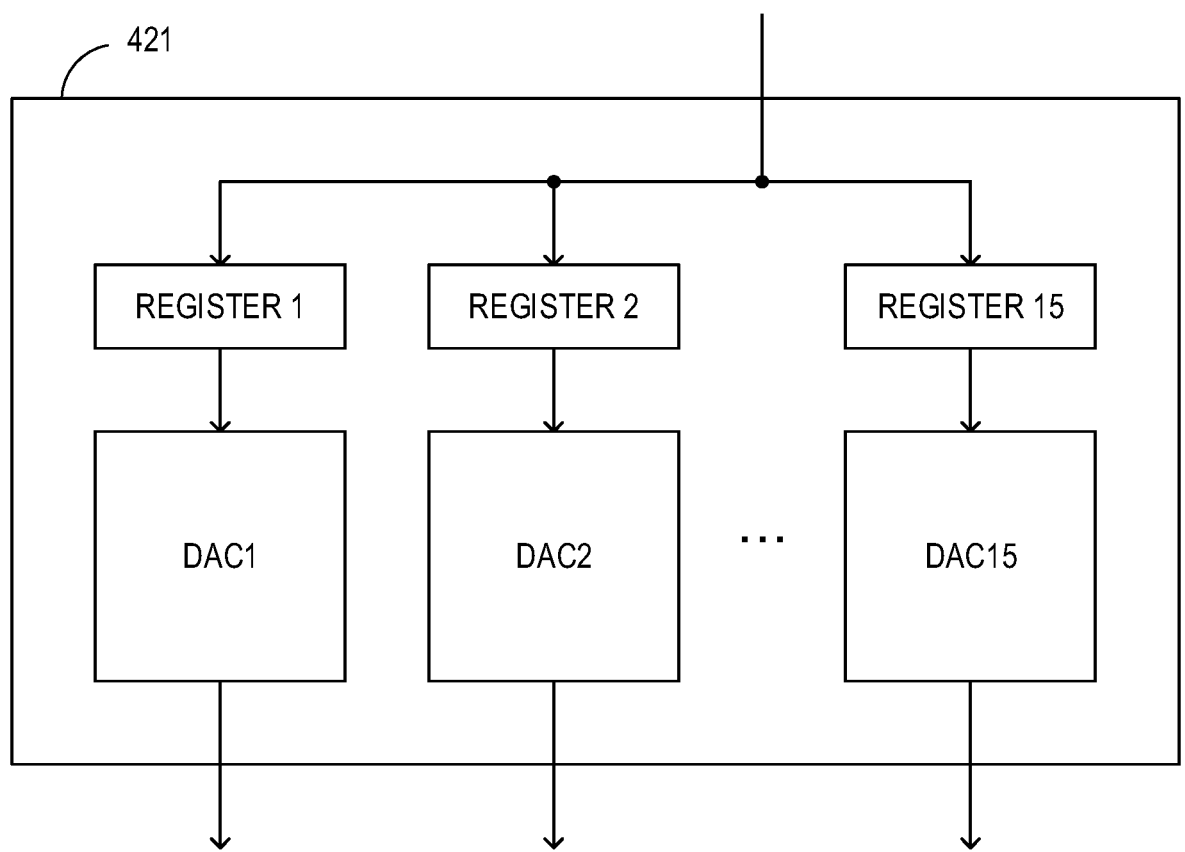
FIG. 9 is a block diagram for illustrating an inner configuration of a drive current setting portion in each of the first to fourth embodiments.

FIG. 9 is a block diagram for illustrating an inner configuration of the drive current setting portion 421. The drive current setting portion 421 includes 15 digital-analog (DA) converters DAC1 to DAC15 connected to the surface emitting element array chips 1 to 15 and 15 registers 1 to 15 configured to store respective digital input setting values from the individual DA converters DAC1 to DAC15. The CPU 400 reads out, from the current setting value storage portion 420 of the exposure head 106, the drive current setting values for the individual surface emitting element array chips 1 to 15, and sets the drive current setting values in the registers 1 to 15. The DA converters DAC1 to DAC15 output, to the individual surface emitting element array chips 1 to 15, respective analog signals corresponding to the digital values set in the registers 1 to 15.

(Procedure for Determining Current Setting Values)

Next, a method of determining the current setting values for the respective drive currents for driving the individual surface emitting element array chips 1 to 29 is described. The current setting values are determined in an adjustment step during the manufacturing of the exposure head 106. The current setting values in the first embodiment are determined for the individual surface emitting element array chips 1 to 29 and set as Iref[1] to Iref[29] in the current setting value storage portion 420. It is assumed herein that an amount of light emitted from the surface emitting element located at a main scan coordinate x when the surface emitting element is turned ON is P[x], while a light amount corresponding to an image data value representing a maximum density (solid image) is the target light amount Ptgt.

When the current setting values are to be determined, first, predetermined current setting values Iref are set in the registers 1 to 15 in the drive current setting portion 421 illustrated in FIG. 9. Then, each of 516 surface emitting elements at main scan coordinates corresponding to the surface emitting element array chip (AC1) is turned ON on a one-by-one basis, and the amount of light P[x] (x=0 to 515) emitted at that time is measured. The light amount measurement is performed by placing a light amount measurement device (not shown) at a position facing the exposure head 106.

Next, a main scan coordinate xmin at which the amount of emitted light P[x] is the smallest (reference amount of emitted light) among the amounts of emitted light P[x] measured in the surface emitting element array chip 1 (AC1) is determined. In the example illustrated in FIG. 8A, the amount of light emitted from the surface emitting element (xmin=0) (indicated by the arrow α) at the main scan coordinate of 0 is the smallest. Then, the setting of the current setting values Iref is changed so as to reduce a difference between a light amount P [xmin] at the time when x=xmin is satisfied and the target light amount Ptgt, and the current setting value Iref satisfying a difference standard determined in advance is determined to be the current setting value Iref[1] for the surface emitting element array chip 1. For the surface emitting element array chips 2 (AC2) to 29 (AC29) also, the current setting values Iref[2] to Iref[29] are determined in accordance with the same method, and the current setting values Iref[2] to Iref[29] are stored in the current setting value storage portion 420. FIG. 8B is a graph for showing light amounts at the time when the surface emitting elements in the surface emitting element array chips 1 to 29 are caused to emit light through use of the determined current setting values Iref[1] to Iref[29]. The light amounts after the drive current adjustment are as shown in FIG. 8B, and each of the blacked-out light amounts in excess of the target light amount Ptgt corresponds to an excess.

(Image Adjustment)

Figure 10A:
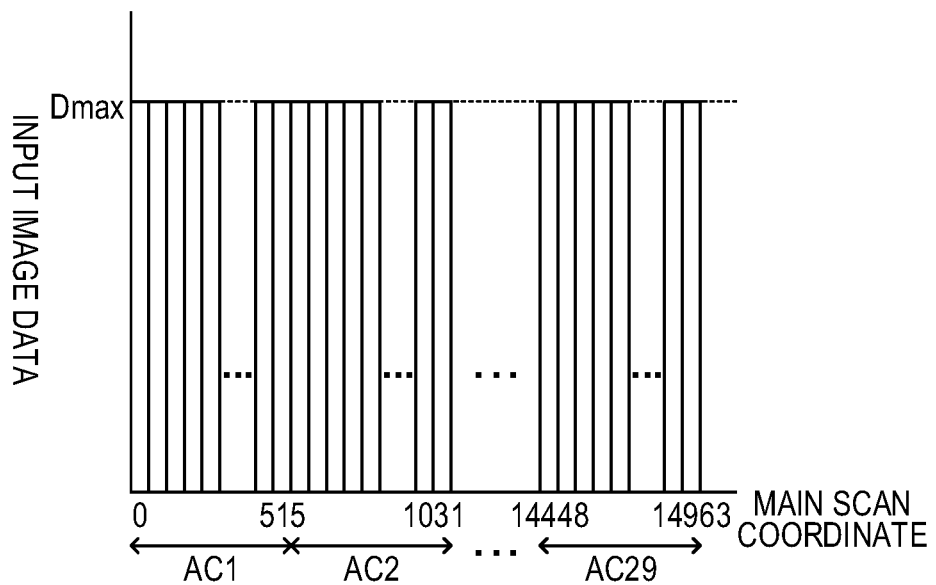
FIG. 10A, FIG. 10B, FIG. 10C, and FIG. 10D are graphs for showing image adjustment in each of the first to fourth embodiments.
Figure 10B:
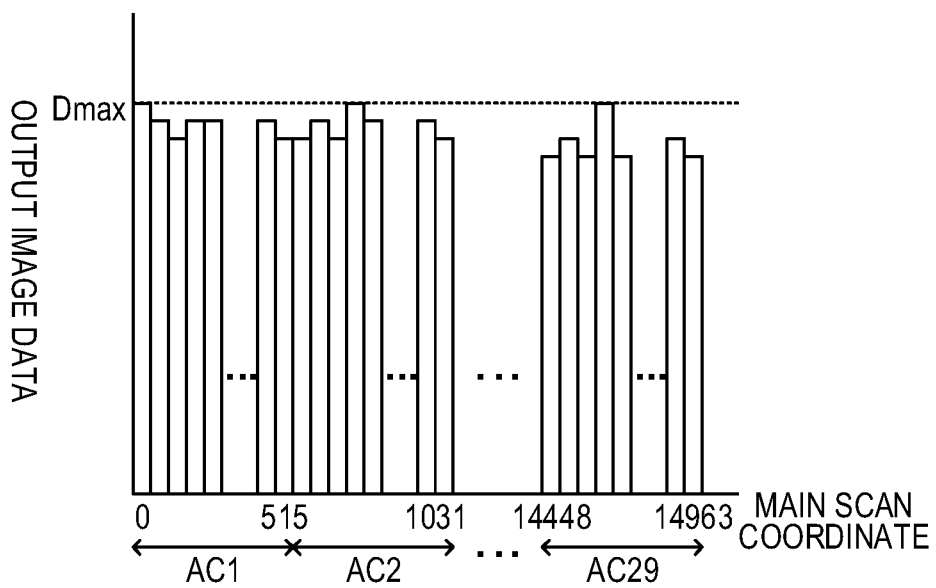
Figure 10C:
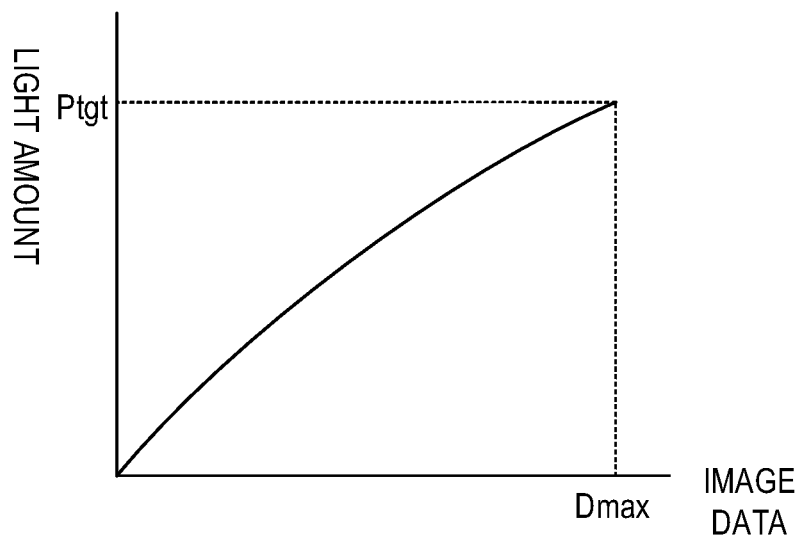

FIG. 10A, FIG. 10B, FIG. 10C, and FIG. 10D are graphs for showing image adjustment in the first embodiment. FIG. 10C is a graph for showing a relationship between the image data (density value) adjusted by the LUT 411 described above and the light amount. In the first embodiment, it is assumed that the image data and the light amount are adjusted by the LUT 411 to have a substantially proportional relationship therebetween. It is assumed that the image data in the first embodiment is represented by an unsigned eight-bit density value, and the drive current adjustment is performed such that a light amount corresponding to an image data value Dmax of 255 representing a maximum density value is equal to the target light amount Ptgt. The eight-bit representation of the image data is exemplary, and the number of bits representing the image data may be other than 8. The image data may also be represented by a brightness value.

Figure 10D:
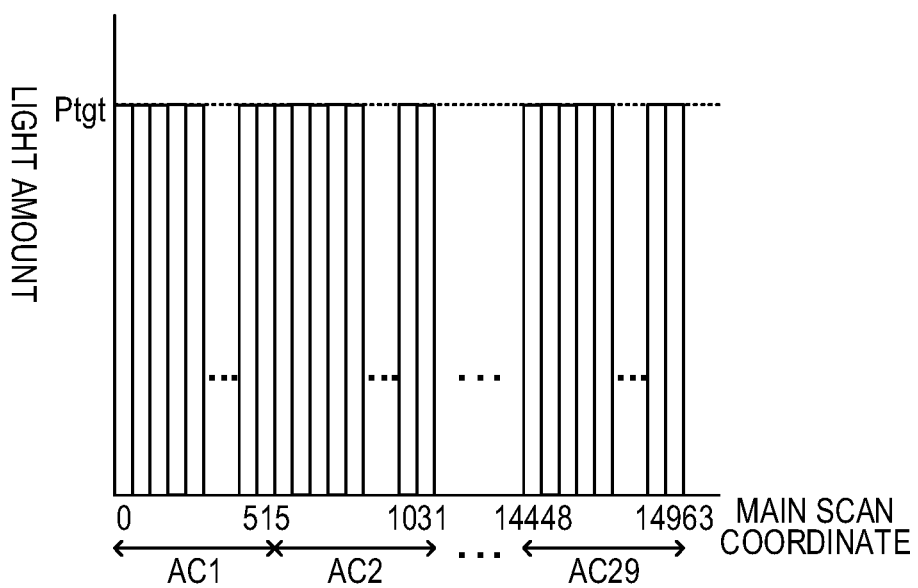

FIG. 10A is a graph for showing input image data from each of the surface emitting elements in the surface emitting element array chips 1 to 29 at the time when the input image data to the image adjustment portion 404 represents a solid image having the image data value Dmax. In FIG. 10A, the vertical axis represents a data value of the input image data, and the horizontal axis represents the main scan coordinates of the surface emitting elements (0 to 14963) in the surface emitting element array chips (AC1, AC2, ..., AC29). When each of the surface emitting elements in the surface emitting element array chips 1 to 29 is caused to emit light with the input image data shown in FIG. 10A, the surface emitting element emits light in the light amount shown in FIG. 8B. As a result, some surface emitting elements emit light in blacked-out light amounts exceeding the target light amount Ptgt. To prevent this, an image data value of the input image data is reduced in accordance with the blacked-out light amount larger than the target light amount Ptgt shown in FIG. 8B. Then, a resulting image data value shown in FIG. 10B is output to allow each of the surface emitting elements to be turned ON with the resulting image data value. In FIG. 10B, the vertical axis represents the data value of the output image data. The output image data has the data value smaller than that of the input image data by the light amount in excess of the target light amount Ptgt. Accordingly, as shown in FIG. 10D, the respective amounts of light emitted from the individual surface emitting elements in the surface emitting element array chips 1 to 29 have substantially constant values, which are approximately equal to the target light amount Ptgt.

(Method of Determining Image Adjustment Values)

Next, a method of determining image adjustment values to be stored in the image adjustment value storage portion 405 of the control substrate 415 is described. Similarly to the drive current setting values described above, the image adjustment values are also determined in the adjustment step during the manufacturing of the exposure head 106. Each of the image adjustment values in the first embodiment is determined for each of the surface emitting elements in the individual surface emitting element array chips 1 to 29, that is, for each of the pixels in the main scanning direction. The image adjustment value at the main scan coordinate x is represented herein by K[x] (x=0 to 14963). The image adjustment value K[x] can be determined through use of each of the drive current setting values Iref[1] to Iref[29] described above based on Expression (2) given below, where P[x] represents an actual amount of emitted light measured by turning ON each of the surface emitting elements in the individual surface emitting element array chips 1 to 29, and Ptgt represents the target light amount.

$$K[x] = \lfloor (Ptgt \times 255)/P[x] \rfloor \quad (2)$$

where $\lfloor A \rfloor$ represents a maximum integer not exceeding A.

In Expression (2), the target light amount Ptgt is multiplied by 255 to allow K[x] to be represented by an unsigned eight-bit integer. As described above, in the first embodiment, the drive current values are set such that the amount of light from the surface emitting element that emits the smallest amount of light is equal to the target light amount Ptgt, and consequently the image adjustment value K[x] is an integer of from 1 to 255. The image adjustment value K[x] thus calculated is stored in the image adjustment value storage portion 405.

(Light Amount Correction Based on Image Adjustment)

Next, light amount correction based on the image adjustment by the image adjustment portion 404 of the control substrate 415 is described. In the first embodiment, when the image adjustment value K[x] is calculated based on Expression (2) given above, the output image data value is calculated based on Expression (3) given below. In Expression (3), it is assumed that a value obtained by multiplying the input image data D[x, y] at the main scan coordinate x and at a sub-scan coordinate y by the image adjustment value K[x] stored in the image adjustment value storage portion 405 is output image data D'[x, y].

$$D'[x,y] = \lfloor (D[x,y] \times K[x])/255 \rfloor \quad (3)$$

where the sub-scan coordinate y is a coordinate incremented every time the line synchronization signal in FIG. 6B is input, which is the coordinate in the direction of rotation of the photosensitive drum 102.

[Quasi-Medium Tone Processing]

Next, image data processing to be performed by the quasi-medium tone processing portion 423 is described. To the quasi-medium tone processing portion 423, image data after the light amount correction output from the image adjustment portion 404 is input. In the image data after the light amount correction, each of the pixels has an eight-bit data length. The quasi-medium tone processing portion 423 performs an error diffusion process on this image to transform the image data to image data in which each of the pixels has a three-bit data length. This can reduce the bit length of the data for each of the pixels, while allowing the density of the input image to be stored, and can reduce a data amount of the image data to be transmitted to the exposure head 106 via the cable 417. As a result, it is possible to further simplify circuits in the drive portions 303a and 303b. In a description of the first embodiment given below, by way of example, the quasi-medium tone processing portion 423 performs a multi-value error diffusion process in which three-bit image data is output. However, the number of bits in image data D"[x, y] after the error diffusion process is not limited to three.

Subsequently, an error diffusion process to be performed by the quasi-medium tone processing portion 423 in the first embodiment is described. The quasi-medium tone processing portion 423 performs an arithmetic operation based on Expression (4) given below, where D'[x, y] represents the image data to be input to the quasi-medium tone processing portion 423 and D"[x, y] represents the image data after the quasi-medium tone processing.

$$D''_{[x,y]} = \begin{cases} 0 & \left( D'_{[x,y]} + \begin{pmatrix} \left(E_{[x-1,y-1]} \times \frac{1}{16}\right) + \left(E_{[x,y-1]} \times \frac{5}{16}\right) + \\ \left(E_{[x+1,y-1]} \times \frac{3}{16}\right) + \left(E_{[x-1,y]} \times \frac{7}{16}\right) \end{pmatrix} \leq 31 \right) \\ 1 & \left( 32 \leq D'_{[x,y]} + \begin{pmatrix} \left(E_{[x-1,y-1]} \times \frac{1}{16}\right) + \left(E_{[x,y-1]} \times \frac{5}{16}\right) + \\ \left(E_{[x+1,y-1]} \times \frac{3}{16}\right) + \left(E_{[x-1,y]} \times \frac{7}{16}\right) \end{pmatrix} \leq 63 \right) \\ 2 & \left( 64 \leq D'_{[x,y]} + \begin{pmatrix} \left(E_{[x-1,y-1]} \times \frac{1}{16}\right) + \left(E_{[x,y-1]} \times \frac{5}{16}\right) + \\ \left(E_{[x+1,y-1]} \times \frac{3}{16}\right) + \left(E_{[x-1,y]} \times \frac{7}{16}\right) \end{pmatrix} \leq 95 \right) \\ 3 & \left( 96 \leq D'_{[x,y]} + \begin{pmatrix} \left(E_{[x-1,y-1]} \times \frac{1}{16}\right) + \left(E_{[x,y-1]} \times \frac{5}{16}\right) + \\ \left(E_{[x+1,y-1]} \times \frac{3}{16}\right) + \left(E_{[x-1,y]} \times \frac{7}{16}\right) \end{pmatrix} \leq 127 \right) \\ 4 & \left( 128 \leq D'_{[x,y]} + \begin{pmatrix} \left(E_{[x-1,y-1]} \times \frac{1}{16}\right) + \left(E_{[x,y-1]} \times \frac{5}{16}\right) + \\ \left(E_{[x+1,y-1]} \times \frac{3}{16}\right) + \left(E_{[x-1,y]} \times \frac{7}{16}\right) \end{pmatrix} \leq 159 \right) \\ 5 & \left( 160 \leq D'_{[x,y]} + \begin{pmatrix} \left(E_{[x-1,y-1]} \times \frac{1}{16}\right) + \left(E_{[x,y-1]} \times \frac{5}{16}\right) + \\ \left(E_{[x+1,y-1]} \times \frac{3}{16}\right) + \left(E_{[x-1,y]} \times \frac{7}{16}\right) \end{pmatrix} \leq 191 \right) \\ 6 & \left( 192 \leq D'_{[x,y]} + \begin{pmatrix} \left(E_{[x-1,y-1]} \times \frac{1}{16}\right) + \left(E_{[x,y-1]} \times \frac{5}{16}\right) + \\ \left(E_{[x+1,y-1]} \times \frac{3}{16}\right) + \left(E_{[x-1,y]} \times \frac{7}{16}\right) \end{pmatrix} \leq 223 \right) \\ 7 & \left( 224 \leq D'_{[x,y]} + \begin{pmatrix} \left(E_{[x-1,y-1]} \times \frac{1}{16}\right) + \left(E_{[x,y-1]} \times \frac{5}{16}\right) + \\ \left(E_{[x+1,y-1]} \times \frac{3}{16}\right) + \left(E_{[x-1,y]} \times \frac{7}{16}\right) \end{pmatrix} \right) \end{cases} \quad (4)$$

In Expression (4), E[x, y] represents an error during quantization, which can be calculated based on Expression (5) given below.

$$E[x,y] = D'[x,y] - ((D''[x,y] \times 32) + 31) \quad (5)$$

Referring to FIG. 11, Expression (4) and Expression (5) are described. FIG. 11 is a graph for showing a relationship between the quantization and the error during the quantization. In FIG. 11, the vertical axis represents a density value represented by the image data, which corresponds to 0 to 255 when the image data has an eight-bit length. The numerical values in the parentheses along the ordinate axis indicate density values corresponding to those when quantization to three bits is performed. The numerical values along the ordinate axis indicate that, when the image data has the eight-bit length, that is, when the data value of the input image data D' is 0, the image data D" after the quasi-medium tone processing (after the quantization) is also 0. Likewise, numerical values along the ordinate axis indicate that, when the data value of the input image data D' is from 1 to 63, from 64 to 95, from 96 to 127, or from 128 to 159, the data value of the image data D" is also 1, 2, 3, or 4. The numerical values along the ordinate axis indicate that, when the data value of the input image data D' is from 160 to 191, from 192 to 223, or from 224 to 255, the data value of the image data D" is 5, 6, or 7.

In FIG. 11, the horizontal axis represents the image data D'[x, y] before the quantization to be input to the quasi-medium tone processing portion 423 and the image data D"[x, y] after the quantization is performed in the quasi-medium tone processing portion 423 (after the quantization). In this case, the input image D'[x, y] is 160 (before the quantization). It is assumed herein that an error of each of surrounding pixels around the input image data D'[x, y] is 0. Specifically, it is assumed that each of errors E[x−1, y−1], E[x, y−1], E[x+1, y−1], and E[x−1, y] is 0. Consequently, according to Expression (4) given above, the image data D"[x, y] after the quasi-medium tone processing (after the quantization) is 5 (which is 191 in an eight-bit representation). In this case, according to Expression (5), the error E[x, y] is −31 (=160−((5×32)+31)). A second term on the right side of Expression (5) has an eight-bit value resulting from transformation, which is obtained by multiplying, by 32, the image data D"[x, y] having a three-bit length after the quasi-medium tone processing and adding 31 to the result of the multiplication. In the first embodiment, the quantization error calculated based on Expression (5) is diffused to surrounding pixels to allow the density to be stored through use of the plurality of pixels.

Figure 12:
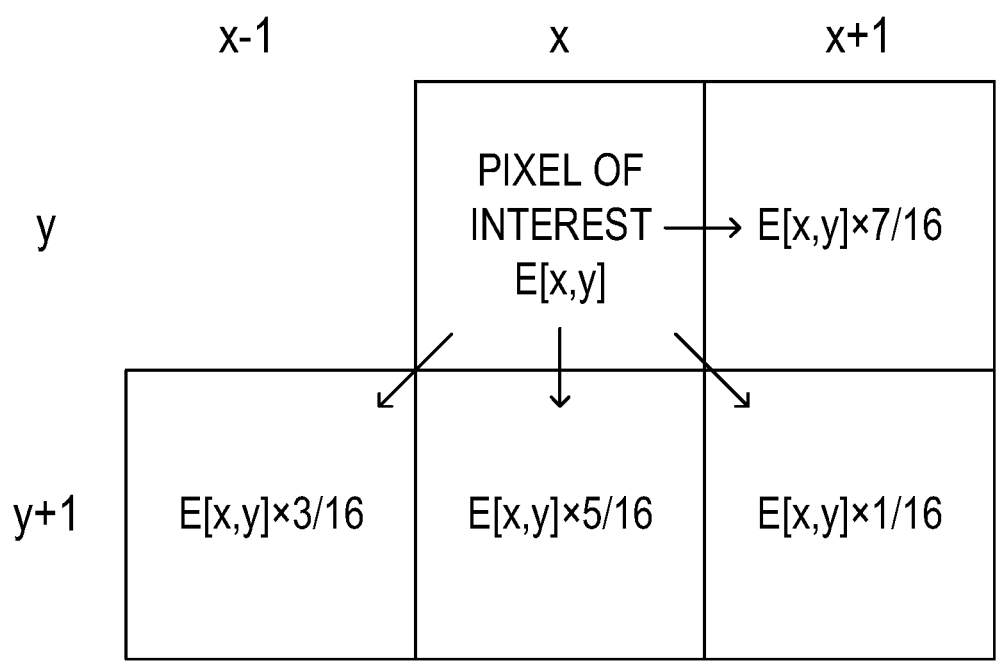
FIG. 12 is a diagram for illustrating a method of diffusing the quantization error in the first embodiment.

FIG. 12 is a diagram for illustrating a method of diffusing an error through quantization. In FIG. 12, the vertical axis represents positions of pixels in the sub-scanning direction, which are y and y+1 illustrated in a top-to-bottom direction, and the horizontal axis represents positions of the pixels in the main scanning direction, which are x−1, x, and x+1 illustrated in a left-to-right direction. It is assumed that, in FIG. 12, a pixel position of a pixel of interest is [x, y], while an error of the pixel of interest is E[x, y]. The error E[x, y]

of the pixel of interest is dispersed to surrounding pixels (adjacent pixels) around the pixel of interest as follows. Specifically, to the pixels [x+1, y], [x−1, y+1], [x, y+1], and [x+1, y+1], 7/16, 3/16, 5/16, and 1/16 of the error E[x, y] are set, respectively. For example, when the pixel of interest in the case of FIG. 11 is assumed to be [x, y], of −31 as the error E[x, y], −13 (≈−31×7/16) and −6 (≈−31×3/16) are set to the pixels [x+1, y] and [x−1, y+1], respectively. Likewise, to the pixels [x, y+1] and [x+1, y+1], −10 (≈−31×5/16) and −2 (≈−31×1/16) are set, respectively. An arithmetic operation using Expression (4) and Expression (5) allows output from the quasi-medium tone processing portion 423 to be quantized to 3 bits and also allows the density to be stored.

As described above, the image adjustment portion 404 performs light amount adjustment for each of the light emitting elements through use of the image data, and the quasi-medium tone processing portion 423 quantizes the image data after the light amount adjustment. This allows the light amount adjustment to be accurately performed and allows the light amount correction to be performed without increasing the amount of data of the image data. In addition, due to the small data amount of the image data, a circuit in the drive portion 303 can be configured without being complicated.

As described above, according to the first embodiment, it is possible to correct variations between the respective amounts of light from the surface emitting elements with a small amount of image data.

Second Embodiment

In the first embodiment, the dispersion values of the pixel are set on the assumption that each of the image adjustment values for the surrounding pixels to which the error of the pixel of interest is to be dispersed is the same as the image adjustment value for the pixel of interest. In a second embodiment of the present invention, description is given of an example in which, when the error of the pixel of interest is to be dispersed, an error value to be dispersed is set in accordance with the image adjustment values for the pixels to which the error is to be dispersed. The overall configuration of the image forming apparatus 10, the configuration of the exposure head 106, the configuration of the drive substrate 202, and the configurations of the control blocks of the control substrate 415 and the drive substrate 202 are the same as those in the first embodiment, and therefore a description thereof is omitted herein.

[Quasi-Medium Tone Processing]

The quasi-medium tone processing portion 423 performs an arithmetic operation for the image data D″[x, y] based on Expression (6) given below, where D′[x, y] represents the image data to be input to the quasi-medium tone processing portion 423 and D″[x, y] represents the image data after the quasi-medium tone processing.

$$D''_{[x,y]} = \begin{cases} 0 \left( D'_{[x,y]} + \dfrac{\left(E_{[x-1,y-1]} \times \dfrac{1}{16} \times \dfrac{k_{[x+1]}}{K_{[x]}}\right) + \left(E_{[x,y-1]} \times \dfrac{5}{16}\right) +}{\left(E_{[x+1,y-1]} \times \dfrac{3}{16} \times \dfrac{k_{[x+1]}}{K_{[x]}}\right) + \left(E_{[x-1,y]} \times \dfrac{7}{16} \times \dfrac{k_{[x+1]}}{K_{[x]}}\right)} \leq 31 \right) \\ 1 \left( 32 \leq D'_{[x,y]} + \dfrac{\left(E_{[x-1,y-1]} \times \dfrac{1}{16} \times \dfrac{k_{[x+1]}}{K_{[x]}}\right) + \left(E_{[x,y-1]} \times \dfrac{5}{16}\right) +}{\left(E_{[x+1,y-1]} \times \dfrac{3}{16} \times \dfrac{k_{[x+1]}}{K_{[x]}}\right) + \left(E_{[y-1,y]} \times \dfrac{7}{16} \times \dfrac{k_{[x+1]}}{K_{[x]}}\right)} \leq 63 \right) \\ 2 \left( 64 \leq D'_{[x,y]} + \dfrac{\left(E_{[x-1,y-1]} \times \dfrac{1}{16} \times \dfrac{k_{[x+1]}}{K_{[x]}}\right) + \left(E_{[x,y-1]} \times \dfrac{5}{16}\right) +}{\left(E_{[x+1,y-1]} \times \dfrac{3}{16} \times \dfrac{k_{[x+1]}}{K_{[x]}}\right) + \left(E_{[x-1,y]} \times \dfrac{7}{16} \times \dfrac{k_{[x+1]}}{K_{[x]}}\right)} \leq 95 \right) \\ 3 \left( 96 \leq D'_{[x,y]} + \dfrac{\left(E_{[x-1,y-1]} \times \dfrac{1}{16} \times \dfrac{k_{[x+1]}}{K_{[x]}}\right) + \left(E_{[x,y-1]} \times \dfrac{5}{16}\right) +}{\left(E_{[x+1,y-1]} \times \dfrac{3}{16} \times \dfrac{k_{[x+1]}}{K_{[x]}}\right) + \left(E_{[x-1,y]} \times \dfrac{7}{16} \times \dfrac{k_{[x+1]}}{K_{[x]}}\right)} \leq 127 \right) \\ 4 \left( 128 \leq D'_{[x,y]} + \dfrac{\left(E_{[x-1,y-1]} \times \dfrac{1}{16} \times \dfrac{k_{[x+1]}}{K_{[x]}}\right) + \left(E_{[x,y-1]} \times \dfrac{5}{16}\right) +}{\left(E_{[x+1,y-1]} \times \dfrac{3}{16} \times \dfrac{k_{[x+1]}}{K_{[x]}}\right) + \left(E_{[x-1,y]} \times \dfrac{7}{16} \times \dfrac{k_{[x+1]}}{K_{[x]}}\right)} \leq 159 \right) \\ 5 \left( 160 \leq D'_{[x,y]} + \dfrac{\left(E_{[x-1,y-1]} \times \dfrac{1}{16} \times \dfrac{k_{[x+1]}}{K_{[x]}}\right) + \left(E_{[x,y-1]} \times \dfrac{5}{16}\right) +}{\left(E_{[x+1,y-1]} \times \dfrac{3}{16} \times \dfrac{k_{[x+1]}}{K_{[x]}}\right) + \left(E_{[x-1,y]} \times \dfrac{7}{16} \times \dfrac{k_{[x+1]}}{K_{[x]}}\right)} \leq 191 \right) \\ 6 \left( 192 \leq D'_{[x,y]} + \dfrac{\left(E_{[x-1,y-1]} \times \dfrac{1}{16} \times \dfrac{k_{[x+1]}}{K_{[x]}}\right) + \left(E_{[x,y-1]} \times \dfrac{5}{16}\right) +}{\left(E_{[x+1,y-1]} \times \dfrac{3}{16} \times \dfrac{k_{[x+1]}}{K_{[x]}}\right) + \left(E_{[x-1,y]} \times \dfrac{7}{16} \times \dfrac{k_{[x+1]}}{K_{[x]}}\right)} \leq 223 \right) \\ 7 \left( 224 \leq D'_{[x,y]} + \dfrac{\left(E_{[x-1,y-1]} \times \dfrac{1}{16} \times \dfrac{k_{[x+1]}}{K_{[x]}}\right) + \left(E_{[x,y-1]} \times \dfrac{5}{16}\right) +}{\left(E_{[x+1,y-1]} \times \dfrac{3}{16} \times \dfrac{k_{[x+1]}}{K_{[x]}}\right) + \left(E_{[x-1,y]} \times \dfrac{7}{16} \times \dfrac{k_{[x+1]}}{K_{[x]}}\right)} \right) \end{cases} \quad (6)$$

The arithmetic operation based on Expression (6) is described with reference to FIG. 13. FIG. 13 is a diagram for illustrating a relationship between the arithmetic operation for the image data D″[x, y] being an output result from the quasi-medium tone processing portion 423 and a surface emitting element X corresponding to the image data. In an upper part of FIG. 13, surface emitting elements X−1, X, and X+1 in the surface emitting element array chip 1 are illustrated. It is assumed herein that respective image adjustment values for the surface emitting elements X−1, X, and X+1 are K[x−1], K[x], and K[x+1]. In FIG. 13, a table in a lower part thereof indicates the respective error values of the destination surrounding pixels to which the error E[x, y] of the pixel [x, y] being the pixel of interest are to be diffused. In a vertical direction of the table, the pixel positions y and y+1 are shown from the top while, in a lateral direction of the table, the pixel positions x−1, x, and x+1 are shown from the left. For the pixel [x+1, y], a value obtained by multiplying the error E[x, y]×(7/16) by (K[x+1]/K[x]) as a ratio of the image adjustment value K[x+1] to the image adjustment value K[x] is assumed to be an error value thereof. Likewise, for the pixel [x−1,y+1], a value obtained by multiplying the error E[x, y]×(3/16) by [K[x−1]/K[x]] as a ratio of the image adjustment value K[x−1] to the image adjustment value K[x] is assumed to be an error value thereof. Further, for the pixel [x,y+1], a value obtained by multiplying the error E[x, y]×(5/16) by 1 being a ratio of the image adjustment value K[x] to the image adjustment value K[x] is assumed to be an error value thereof. Further, for the pixel [x+1, y+1], a value obtained by multiplying the error E[x, y]×(1/16) by (K[x+1]/K[x]) being a ratio of the image adjustment value K[x+1] to the image adjustment value K[x] is assumed to be an error value thereof.

The value of the image data D"[x, y] output from the quasi-medium tone processing portion 423 represents a lighting-up time, which determines an accumulated light amount when the surface emitting element X eventually lights up the pixel corresponding to the coordinates of the image data D"[x, y]. This is because, as described above, the PWM signal generating portion 412 eventually sets the pulse width of the PWM signal based on the data value of the image data D"[x, y]. In the second embodiment, an error that has occurred during the calculation of the image data D"[x, y] is diffused to the surrounding pixels to allow the density to be stored. However, as illustrated in FIG. 13, the image data at each of the destinations of the diffused error is diffused as image data for a surface emitting element as a luminous point at a different main scan coordinate, such as the surface emitting element [x−1] or the surface emitting element [x+1].

Figure 14A:
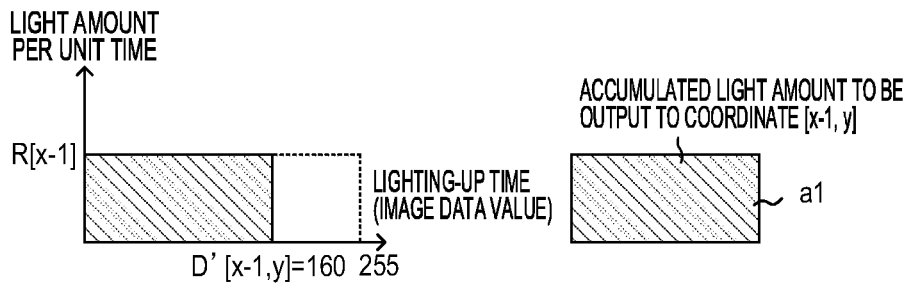
FIG. 14A, FIG. 14B, FIG. 14C, and FIG. 14D are diagrams for illustrating a correspondence between an error of image data and an error of a light amount in the second embodiment.

A problem resulting from the diffusion of the error of the pixel of interest to the surrounding pixels is described with reference to the drawings. FIG. 14A, FIG. 14B, FIG. 14C, and FIG. 14D are diagrams for illustrating a correspondence between an error of the image data and an error of the emitted light amount. FIG. 14A is a diagram for illustrating the image data D'[x−1, y] after the light amount correction for the coordinates [x−1, y] and the accumulated light amount. In FIG. 14A, the vertical axis represents an amount of light (amount of light emitted) from a pixel per unit time, and the horizontal axis represents an image data value indicating the lighting-up time for the pixel. In FIG. 14A, the image data D'[x−1, y] input to the quasi-medium tone processing portion 423 has a value of 160. The image D'[x−1, y] corresponds to the pulse width of the PWM signal, that is, the lighting-up time. When it is assumed that R[x−1] represents an amount of light from the surface emitting element per unit time that corresponds to the image data D'[x−1, y], the accumulated light amount is represented by an area of a shaded portion a1 on the right side of FIG. 14A, which is given by "Light Amount R[x−1]×Image Data D'[x−1,y]". The unit time mentioned herein is a time obtained by dividing a maximum lighting-up time for one pixel by 256 (at eight-bit accuracy).

Figure 14B:
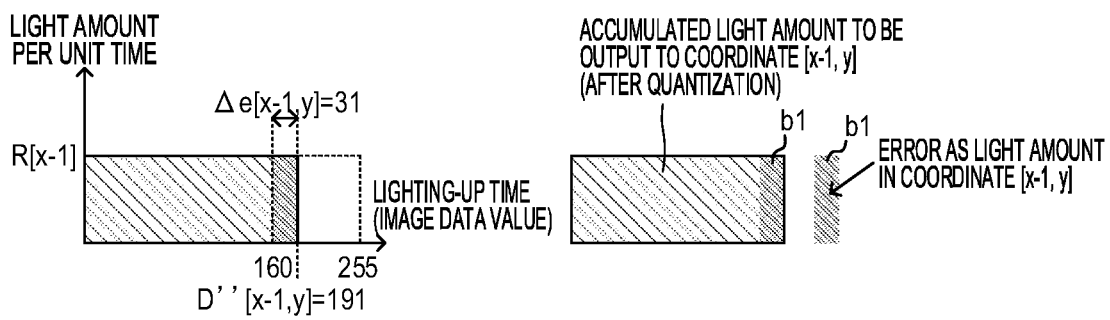

FIG. 14B is a diagram for illustrating the image data D"[x−1, y] resulting from quantization of the image data D'[x−1, y] input to the quasi-medium tone processing portion 423 by the quasi-medium tone processing portion 423. In FIG. 14B, the horizontal axis and the vertical axis are the same as those in FIG. 14A, and therefore a description thereof is omitted. It is assumed herein that there is no error propagation from the surrounding pixels to the pixel [x−1, y]. Accordingly, when the image data D'[x−1, y] is equal to 160, according to Expression (6) given above, the image data"[x−1, y] is equal to 5, where "5" is a value in three-bit data. When "5" in the three-bit data is converted to a value in eight-bit data, in accordance with the second term on the right side of Expression (5), "5" corresponds a lighting-up time of 191. Accordingly, as a result of the quantization process performed by the quasi-medium tone processing portion 423, the lighting-up time for the pixel [x−1, y] is prolonged by an error Δe[x−1, y] (which is 31 (=191−160) in this example) resulting from the quantization of the lighting-up time. In this case, it follows that the quantization of the light amount has caused the error given by Δe[x−1, y]×R[x−1] (area of a hatched portion b1 on the right side of FIG. 14B).

Figure 14C:
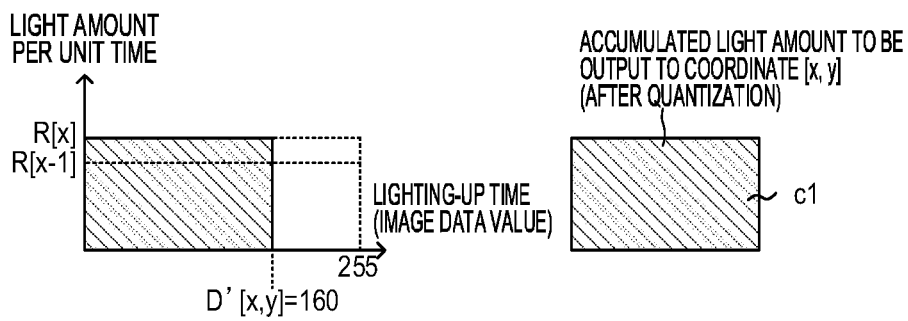

FIG. 14C is a diagram for illustrating the image data D'[x, y] after the light amount correction for the coordinates [x, y] and the accumulated light amount. In FIG. 14C, the horizontal axis and the vertical axis are the same as those in FIG. 14A, and therefore a description thereof is omitted. In the same manner as in FIG. 14A, in FIG. 14C also, it is assumed that the image data D'[x, y] is equal to 160. However, a light amount R[x] per unit time of the surface emitting element corresponding to the image data D'[x, y] is larger than a light amount R[x−1] per unit time of the surface emitting element corresponding to the image data D'[x−1]. Accordingly, even though each of the image data D'[x−1,y] and the image data D'[x, y] has the same lighting-up time of 160, the accumulated light amount indicated by a shaded portion c1 on the right side of FIG. 14B is larger in the image data D'[x, y] than in the image data D'[x−1, y].

Figure 14D:
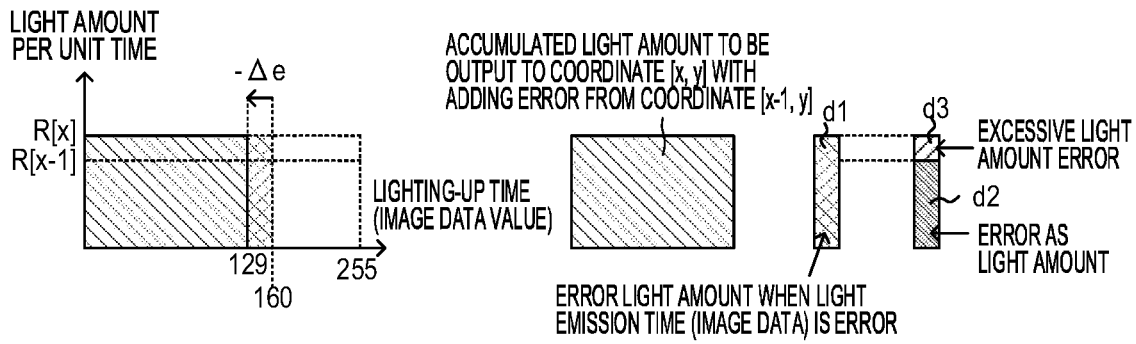

FIG. 14D is a diagram for illustrating a lighting-up time considering an error that has occurred when all the errors that have occurred during the quantization of the image data D'[x−1,y] are propagated (diffused) to the image data D'[x, y], and an accumulated light amount. As illustrated in FIG. 14B, the error Δe[x−1, y] is 31, and consequently, in the image data D'[x, y], the lighting-up time is shortened by the error Δe[x−1, y] (=31) (which is −Δe in FIG. 14B) to allow the density to be stored. In other words, from the image data D'[x, y], the error Δe[x−1, y] is subtracted. However, when the image data is corrected only with the lighting-up time, the accumulated light amount represented by a hatched portion d1 illustrated on the right side of FIG. 14D (in FIG. 14B, an error light amount when the light emission time (image data) is assumed to be an error) is subtracted disadvantageously. As a result, while only the light amount represented by a hatched portion d2 (error as a light amount in the drawing) is originally intended to be subtracted, excessive correction is performed disadvantageously by a shaded portion d3 (excessive light amount error in FIG. 14B). Consequently, the light amount has an error.

Accordingly, in the second embodiment, when the error in the surface emitting element [x] is to be diffused to the surface emitting element [x−1], the following correction is performed. Specifically, the error to be diffused is multiplied by a value (K[x−1]/K[x]) obtained by dividing the image adjustment value K[x−1] for the surface emitting element [x−1] corresponding to the destination of the diffused error by the image adjustment value K[x] for the surface emitting element [x] corresponding to the quantized pixel. Thus, it is possible to correct the weight of the error resulting from the different emitted light amounts, diffuse a highly accurate error as the emitted light amount, and more accurately store the density.

As described above, according to the second embodiment, it is possible to correct variations between the respective amounts of light emitted from the surface emitting elements through use of a smaller amount of image data.

Third Embodiment

In each of the first and second embodiments, description has been given of the error diffusion process for the surface emitting elements in the same surface emitting element array chip. In a third embodiment of the present invention, description is given of an example of the error diffusion process to be performed when the destination of the error diffused by the error diffusion process is the surface emitting element in the surface emitting element array chip different from the surface emitting element array chip in which the error has occurred. The overall configuration of the image forming apparatus 10, the configuration of the exposure head 106, the configuration of the drive substrate 202, and the configurations of the control blocks of the control substrate 415 and the drive substrate 202 are the same as those in the first and second embodiments, and therefore a description thereof is omitted herein.

[Relationship Between Surface Emitting Element and Emitted Light Amount]

Figure 15:
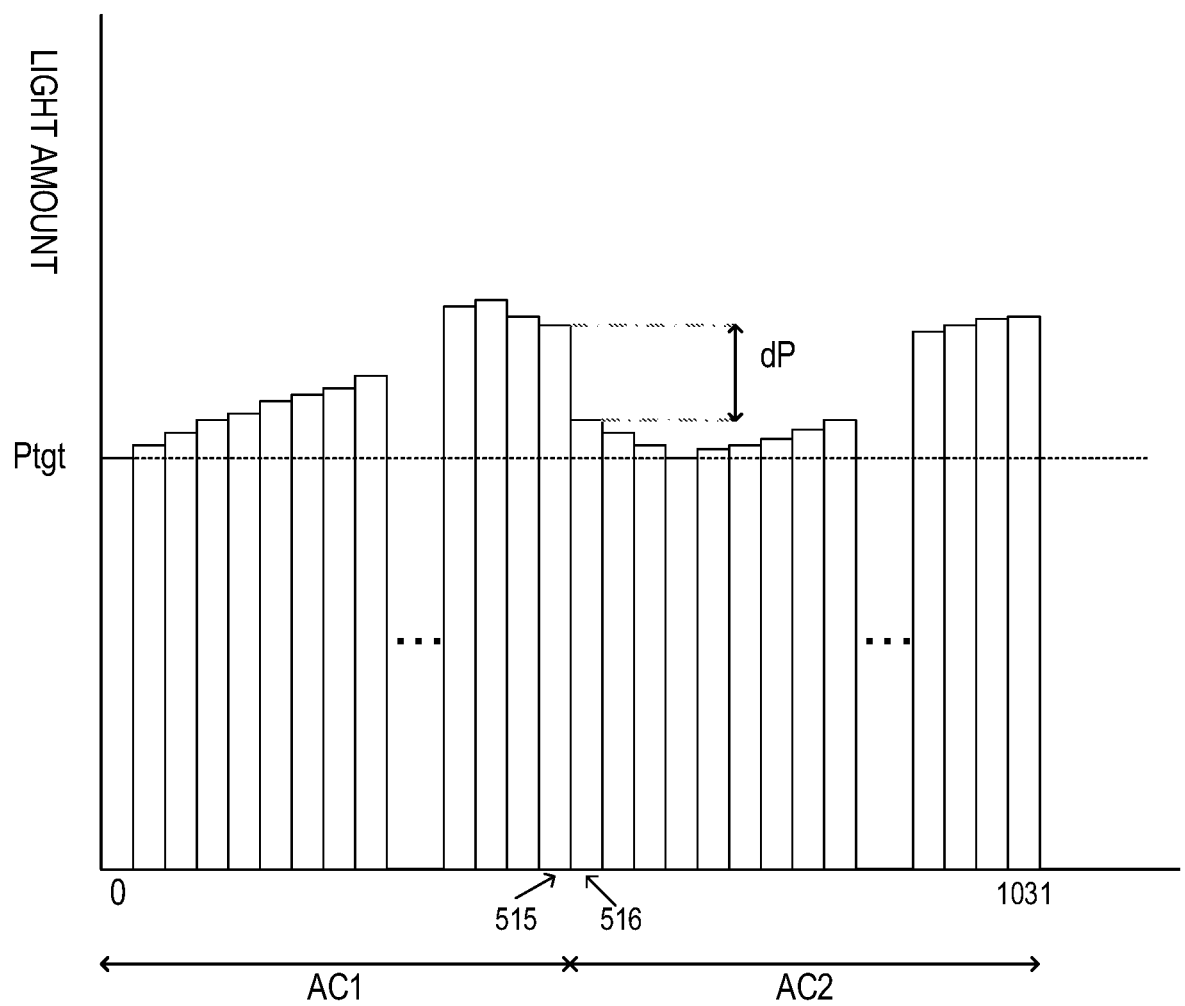
FIG. 15 is a graph for showing a relationship between each of the surface emitting elements and the light amount after the drive current adjustment in the third embodiment.

FIG. 15 is a graph for showing a relationship between each of the surface emitting elements in the surface emitting element array chips (AC) and an amount of light emitted from the surface emitting element after the drive current adjustment is performed. In FIG. 15, the vertical axis represents the light amount, and the horizontal axis represents the individual surface emitting elements (0 to 1031) in the surface emitting element array chips AC1 and AC2. Ptgt represents the target light amount of the amount of light output from each of the surface emitting elements after the drive current adjustment is performed. The surface emitting element array chips are manufactured by being diced from a wafer. Accordingly, the amounts of light from the individual surface emitting elements in the same surface emitting element array chip tend to be continuous. In other words, the adjacent surface emitting elements in the region of the same surface emitting element array chip (AC), such as the surface emitting element array chip AC1 or AC2, have a small light amount difference therebetween. Meanwhile, the surface emitting elements belonging to the different surface emitting element array chips separated by the boundary portion interposed therebetween may possibly be in the surface emitting element array chips contained in different wafers or located at different positions on the same wafer. Accordingly, as indicated by an arrow dP in FIG. 15, the surface emitting elements in the different surface emitting element array chips have a large light amount difference therebetween.

[Quasi-Medium Tone Processing]

Accordingly, in the third embodiment, in consideration also of such tendencies of the respective light amounts of the individual surface emitting elements as illustrated in FIG. 15, the quasi-medium tone processing portion 423 performs the following error diffusion process. The quasi-medium tone processing portion 423 performs an arithmetic operation for the image data D"[x,y] based on Expression (7) given below, where D'[x,y] represents the image data input to the quasi-medium tone processing portion 423 and $$D''_{[x,y]} = \begin{cases} 0 \left( D'_{[x,y]} + \dfrac{\left(E_{[x-1,y-1]} \times \frac{1}{16} \times B_1\right) + \left(E_{[x,y-1]} \times \frac{5}{16}\right) +}{\left(E_{[x+1,y-1]} \times \frac{3}{16} \times B - 2\right) + \left(E_{[x-1,y]} \times \frac{7}{16} \times B_1\right)} \leq 31 \right) \\ 1 \left( 32 \leq D'_{[x,y]} + \dfrac{\left(E_{[x-1,y-1]} \times \frac{1}{16} \times B_1\right) + \left(E_{[x,y-1]} \times \frac{5}{16}\right) +}{\left(E_{[x+1,y-1]} \times \frac{3}{16} \times B_2\right) + \left(E_{[y-1,y]} \times \frac{7}{16} \times B_1\right)} \leq 63 \right) \\ 2 \left( 64 \leq D'_{[x,y]} + \dfrac{\left(E_{[x-1,y-1]} \times \frac{1}{16} \times B_1\right) + \left(E_{[x,y-1]} \times \frac{5}{16}\right) +}{\left(E_{[x+1,y-1]} \times \frac{3}{16} \times B_2\right) + \left(E_{[x-1,y]} \times \frac{7}{16} \times B_1\right)} \leq 95 \right) \\ 3 \left( 96 \leq D'_{[x,y]} + \dfrac{\left(E_{[x-1,y-1]} \times \frac{1}{16} \times \frac{k_{[x+1]}}{K_{[x]}}\right) + \left(E_{[x,y-1]} \times \frac{5}{16}\right) +}{\left(E_{[x+1,y-1]} \times \frac{3}{16} \times B_1\right) + \left(E_{[x-1,y]} \times \frac{7}{16} \times B_1\right)} \leq 127 \right) \\ 4 \left( 128 \leq D'_{[x,y]} + \dfrac{\left(E_{[x-1,y-1]} \times \frac{1}{16} \times \frac{k_{[x+1]}}{K_{[x]}}\right) + \left(E_{[x,y-1]} \times \frac{5}{16}\right) +}{\left(E_{[x+1,y-1]} \times \frac{3}{16} \times B_2\right) + \left(E_{[x-1,y]} \times \frac{7}{16} \times B_1\right)} \leq 159 \right) \\ 5 \left( 160 \leq D'_{[x,y]} + \dfrac{\left(E_{[x-1,y-1]} \times \frac{1}{16} \times B_1\right) + \left(E_{[x,y-1]} \times \frac{5}{16}\right) +}{\left(E_{[x+1,y-1]} \times \frac{3}{16} \times B_2\right) + \left(E_{[x-1,y]} \times \frac{7}{16} \times B_1\right)} \leq 191 \right) \\ 6 \left( 192 \leq D'_{[x,y]} + \dfrac{\left(E_{[x-1,y-1]} \times \frac{1}{16} \times B_1\right) + \left(E_{[x,y-1]} \times \frac{5}{16}\right) +}{\left(E_{[x+1,y-1]} \times \frac{3}{16} \times B_2\right) + \left(E_{[x-1,y]} \times \frac{7}{16} \times B_1\right)} \leq 223 \right) \\ 7 \left( 224 \leq D'_{[x,y]} + \dfrac{\left(E_{[x-1,y-1]} \times \frac{1}{16} \times B_1\right) + \left(E_{[x,y-1]} \times \frac{5}{16}\right) +}{\left(E_{[x+1,y-1]} \times \frac{3}{16} \times B_2\right) + \left(E_{[x-1,y]} \times \frac{7}{16} \times B_1\right)} \right) \end{cases} \quad (7)$$

In the third embodiment, Expression (7) is different from Expression (4) in the first embodiment in that the respective errors of the pixel positions [x−1] and [x+1] are multiplied by B1 and B2. In Expression (7) in the third embodiment, B1 and B2 are error correction coefficients for correcting the errors to be diffused when the surface emitting element corresponding to the pixel position [x] and the surface emitting element adjacent thereto are in the different surface emitting element array chips. The error correction coefficients B1 and B2 are determined by Expression (8) and Expression (9), respectively, each given below. In Expression (8) and Expression (9), N represents an integer of from 1 to 29 corresponding to each of the surface emitting element array chips.

$$B1 = \begin{cases} \frac{K[x]}{K[x-1]} (x = 516N) \\ 1 \text{ (Other than the above conditions)} \end{cases} \quad (8)$$

$$B2 = \begin{cases} \frac{K[x]}{K[x+1]} (x = 516\ N - 1) \\ 1 \text{ (Other than the above conditions)} \end{cases} \quad (9)$$

In accordance with Expression (8), the error correction coefficient B1 is given by (K[x]/K[x−1]) when the pixel position [x] of the pixel of interest [x,y] corresponds to the surface emitting element at an end portion (x=516N) of the surface emitting element array chip in which the main scan coordinate is smaller. Otherwise, B1 is 1. Meanwhile, the error correction coefficient B2 is given by (K[x]/K[x+1]) when the pixel position [x] of the pixel of interest [x,y] corresponds to the surface emitting element at an end portion (x=516N−1) of the surface emitting element array chip in which the main scan coordinate is larger. Otherwise, B2 is 1.

Figure 16A:
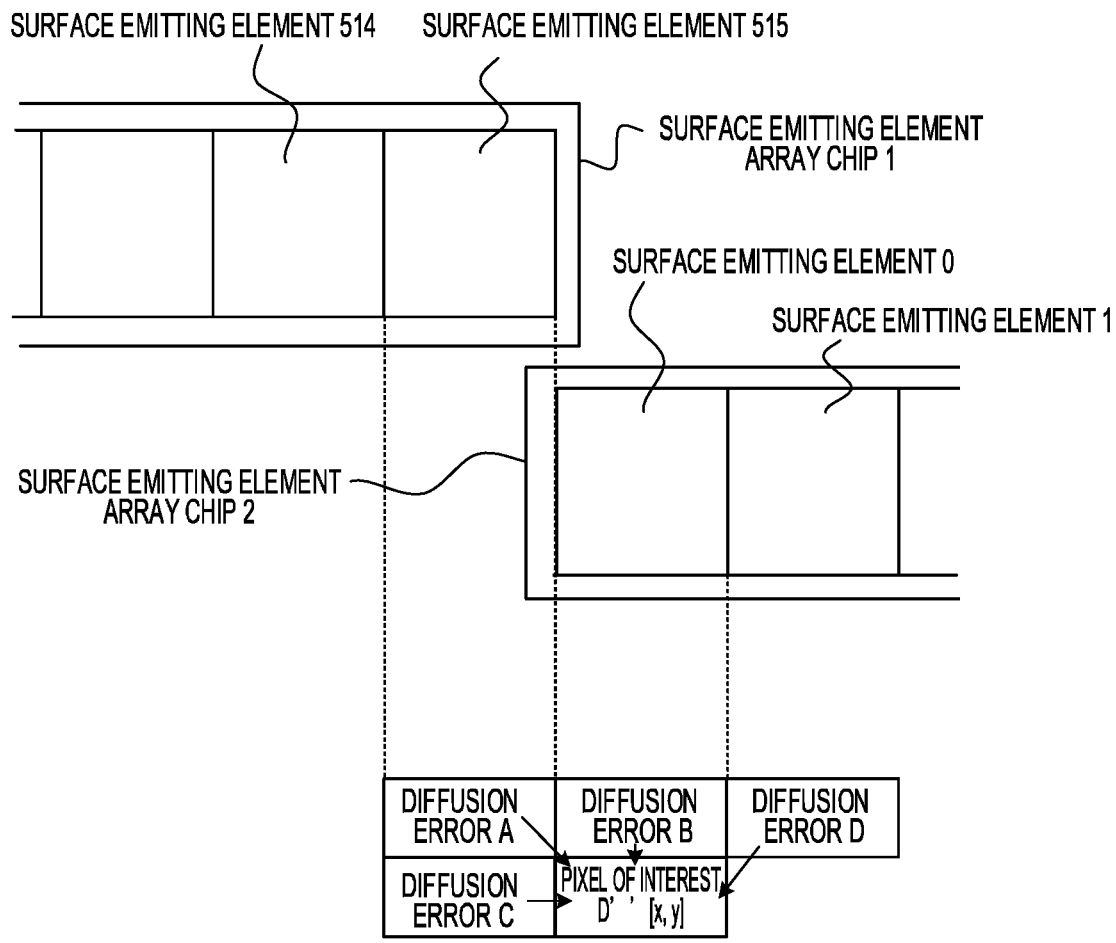
FIG. 16A and FIG. 16B are diagrams for illustrating a relationship between the surface emitting elements at respective end portions of the surface emitting element array chips and the diffusion of the quantization error in the third embodiment.

The error correction coefficients B1 and B2 are described with reference to FIG. 16A and FIG. 16B. In FIG. 16A, there are illustrated a conceptual diagram (in an upper part thereof) when the quasi-medium tone processing unit 423 performs processing of a pixel at a pixel position [x] of 516 in the main scanning direction, and calculation formulae (in a lower part thereof) for diffusion errors from surrounding pixels. In the lower part of FIG. 16A, assuming that the pixel position of the pixel of interest is [x,y], a diffusion error A indicates a diffusion error from a pixel at a pixel position [x−1,y−1] to the pixel of interest [x,y], and a diffusion error B indicates a diffusion error from a pixel at a pixel position [x,y−1] to the pixel of interest [x,y]. Likewise, a diffusion error C indicates a diffusion error from a pixel at a pixel position [x−1,y] to the pixel of interest [x,y], and a diffusion error D indicates a diffusion error from a pixel at a pixel position [x+1,y−1] to the pixel of interest [x,y]. The diffusion errors A to D in FIG. 16B are the same as those in FIG. 16A.

As illustrated in the upper part of FIG. 16A, the surface emitting element at the pixel position [x] of 516 in the main scanning direction corresponds to a surface emitting element 0 in a surface emitting element array chip 2. Accordingly, when the pixel at the pixel position [x] of 516 is quantized, the following process is performed. Values obtained by multiplying, by weight coefficients, respective errors that have occurred when image data D'[515,y−1], image data D'[516,y−1], image data D'[517,y−1], and image data D'[515,y] of the surrounding pixels are quantized are added up as an error of the pixel at the pixel position [x,y], and a resulting sum is quantized. At that time, an error from the image data for causing the surface emitting element 515 in the surface emitting element array chip 1 to emit light may provide a large light amount difference between the surface emitting element array chip 1 and the surface emitting element array chip 2 to which the surface emitting element 516 belongs. Accordingly, in consideration also of the image adjustment values at the pixel position [x] of 515 and at the pixel position [x] of 516, the error is multiplied by a value given by (Image Adjustment Value K[x]/Image Adjustment Value K[x−1]) to perform correction. At this time, in accordance with Expression (9), the error correction coefficient B2 is 1.

Figure 16B:
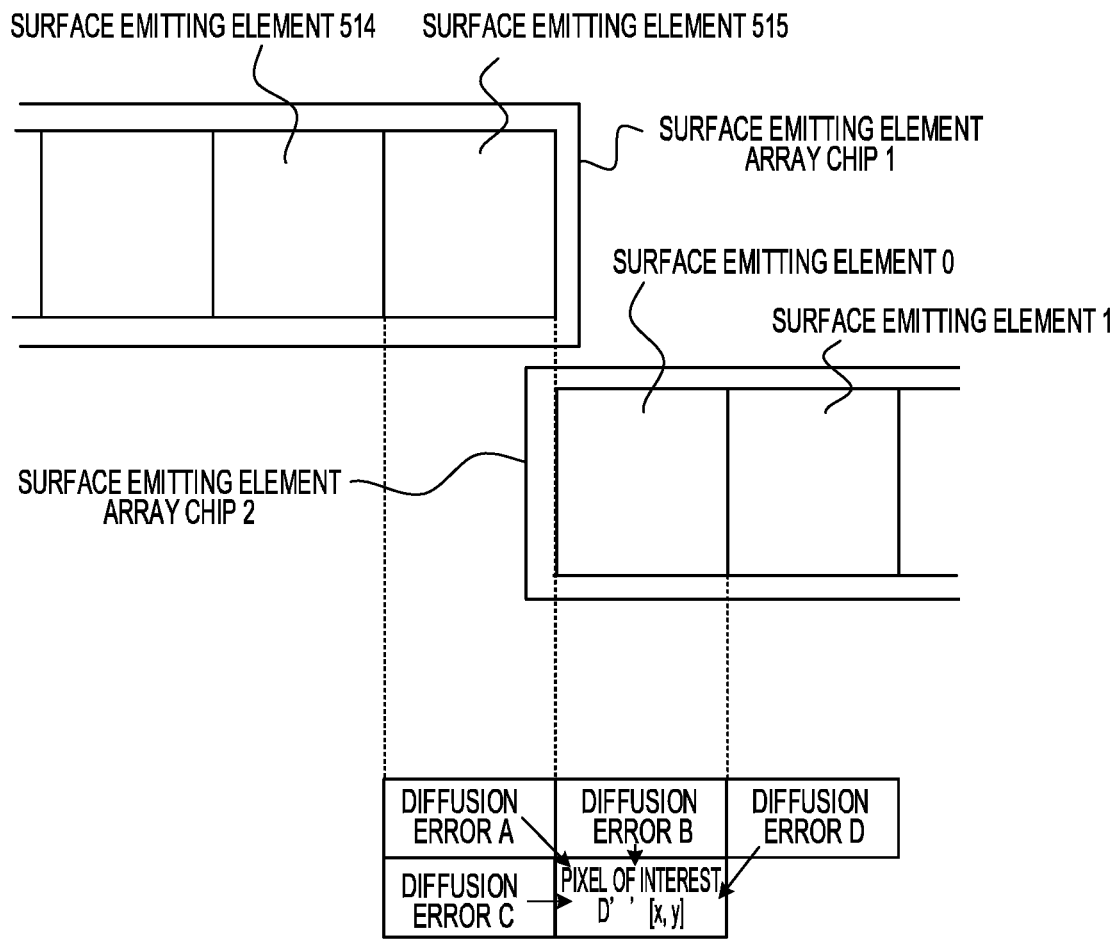

In FIG. 16B, there are illustrated a conceptual diagram (in an upper part thereof) when the quasi-medium tone processing unit 423 performs processing of a pixel at the pixel position [x] of 515 in the main scanning direction, and calculation formulae (in a lower part thereof) for diffusion errors from surrounding pixels (in the lower part thereof). The calculation formulae for the diffusion errors A to D in the lower part of FIG. 16B are different from those illustrated in FIG. 16A, but the pixel positions of the diffusion errors A to D are the same as those illustrated in FIG. 16A, and therefore a description thereof is omitted herein.

As illustrated in the upper part of FIG. 16B, the surface emitting element at the pixel position [x] of 515 in the main scanning direction corresponds to a surface emitting element 515 in the surface emitting element array chip 1. Accordingly, when the pixel at the pixel position [x] of 515 is quantized, the following process is performed. Values obtained by multiplying, by weight coefficients, respective errors that have occurred when image data D'[514, y−1], the image data D'[515, y−1], the image data D'[516, y−1], and image data D'[514, y] of the surrounding pixels are quantized are added up as an error of the pixel at the pixel position [x, y], and a resulting sum is quantized. At that time, an error from the image data for causing the surface emitting element 516 in the surface emitting element array chip 2 to emit light may provide a large light amount difference between the surface emitting element array chip 2 and the surface emitting element array chip 1, to which the surface emitting element 515 belongs. Accordingly, in consideration also of the image adjustment values at the pixel position [x] of 515 and at the pixel position [x] of 516, the error is multiplied by a value given by (Image Adjustment Value K[x]/Image Adjustment Value K[x+1]) to perform correction. At this time, in accordance with Expression (8), the error correction coefficient B1 is 1.

By thus correcting the diffusion error only when the quantization error is propagated between the different surface emitting element array chips, it is possible to reduce an amount of arithmetic operation for the diffusion error. In the case of hardware implementation, a circuit can be simplified while, in the case of software implementation, an arithmetic operation time can be reduced.

As described above, according to the third embodiment, variations between the respective amounts of light emitted from the individual surface emitting elements can be corrected through use of a smaller amount of image data.

Fourth Embodiment

In the third embodiment, description has been given of the example of the error diffusion process to be performed when the destination of the error diffused by the error diffusion process is the surface emitting element in the surface emitting element array chip different from the surface emitting element array chip in which the error has occurred. In a fourth embodiment of the present invention, description is given of a method of determining the error correction coefficients different from the method of determining the error correction coefficients used in the third embodiment. The overall configuration of the image forming apparatus 10, the configuration of the exposure head 106, the configuration of the drive substrate 202, and the configurations of the control blocks of the control substrate 415 and the drive substrate 202 are the same as those in the third embodiment, and therefore a description thereof is omitted herein.

[Quasi-Medium Tone Processing]

In the fourth embodiment, in the same manner as in the third embodiment described above, in consideration also of the tendencies of the respective light amounts of the individual surface emitting elements, the quasi-medium tone processing portion 423 performs an error diffusion process through use of Expression (7) described in the third embodiment. At that time, the error correction coefficients B1 and B2 used in Expression (7) are determined based on Expression (10) and Expression (11), respectively, each given below.

$$B1 = \begin{cases} \dfrac{Ptgt}{P\max}(x = 516\ N \text{ and } K[x-1] > K[x]) \\ 1 \text{ (Other than the above conditions)} \end{cases} \quad (10)$$

$$B2 = \begin{cases} \dfrac{Ptgt}{P\max}(x = 516\ N - 1 \text{ and } K[x+1] > K[x]) \\ 1 \text{ (Other than the above conditions)} \end{cases} \quad (11)$$

In Expression (10) and Expression (11), N represents an integer of from 1 to 29 corresponding to each of the surface emitting element array chips. Further, Pmax used in Expression (10) and Expression (11) represents a maximum amount of light generated after the drive current adjustment is performed. In this case, the maximum light amount is assumed to be a maximum light amount value (maximum emitted light amount) including manufacturing variations. After the drive current adjustment, none of the surface emitting elements generates light in an amount exceeding Pmax, and therefore Pmax can be set as a constant value.

In the same manner as in Expression (8) in the third embodiment, the error correction coefficient B1 in the fourth embodiment is the coefficient for the surface emitting elements each at the position [x] of 516N in the main scanning direction, that is, the adjacent surface emitting elements contained in the different surface emitting element array chips. In other words, the error correction coefficient B1 indicates a condition under which a quantization error of a pixel resulting from an arithmetic operation is propagated between the different surface emitting element array chips. In addition, when a condition given by (Image Adjustment Value K[x−1]>Image Adjustment Value K[x]) is satisfied, the error correction coefficient B1 has a value given by (Target Light Amount Ptgt/Maximum Light Amount Pmax).

Figure 17A:
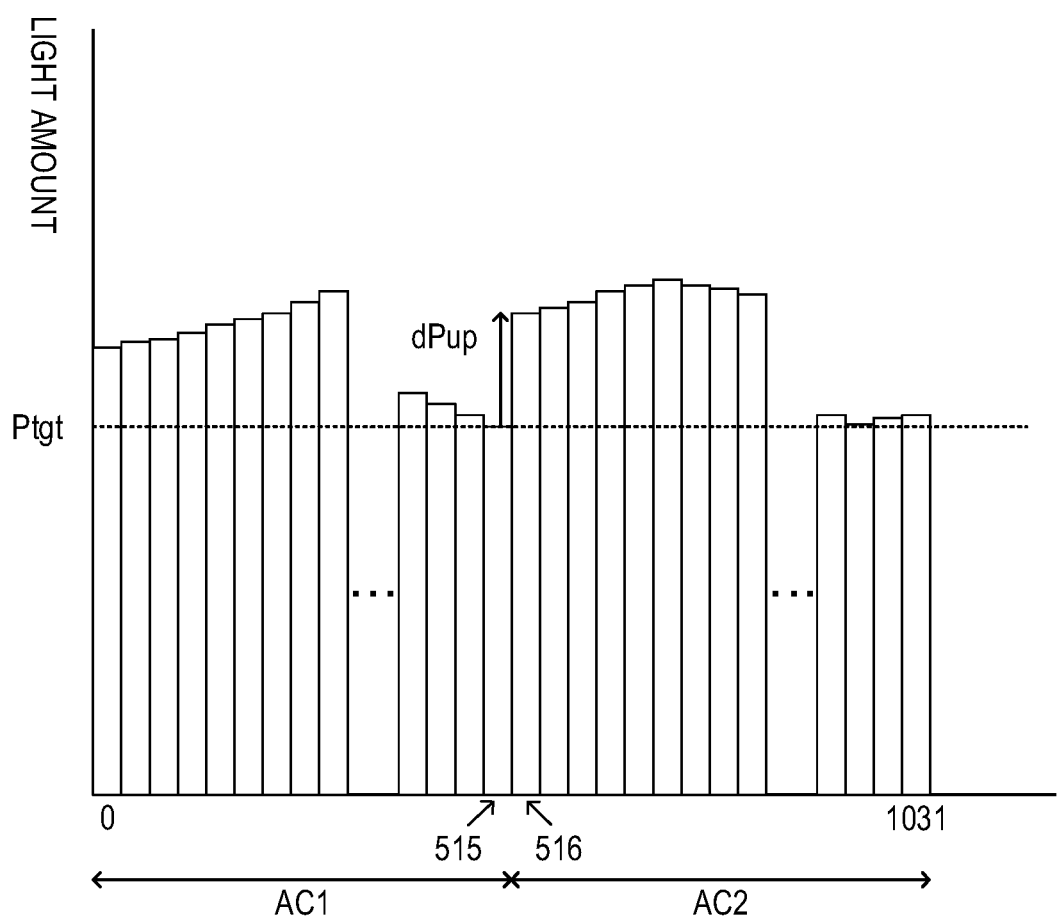

The condition given by (Image Adjustment Value K[x−1]>Image Adjustment Value K[x]) is described with reference to the drawings. FIG. 17A and FIG. 17B are graphs for showing an amount of light from each of the surface emitting elements in the surface emitting element array chips 1 and 2 after the drive current adjustment. In each of FIG. 17A and FIG. 17B, the vertical axis represents the light amount and Ptgt represents the target light amount, and the horizontal axis represents the individual surface emitting elements (0 to 1031) in the surface emitting element array chips 1 and 2. The positions of the surface emitting elements in the surface emitting element array chip 1 (AC1) are from 0 to 515, and the positions of the surface emitting elements in the surface emitting element array chip 2 (AC2) are from 516 to 1031. A comparison is made below between an amount of light P[516] emitted from the surface emitting element at the position of 516 (leftmost surface emitting element in the region of AC2 in FIG. 17A and FIG. 17B) and an amount of light P[515] emitted from the surface emitting element at the position of 515 (rightmost surface emitting element in the region of AC1 in FIG. 17A and FIG. 17B). As shown in FIG. 17A, when the light amount P[516] is larger than the light amount P[515] (at the rightmost position in the AC1 region) (a light amount difference such as represented by dPup in FIG. 17A), the image adjustment value K[515] and the image adjustment value K[516] satisfy K[515]>K[516]. In this case, in accordance with Expression (10), the error correction coefficient B1 is set to a value given by (Target Light Amount Ptgt/Maximum Light Amount Pmax). Meanwhile, as shown in FIG. 17B, when the light amount P[516] is equal to or less than the light amount P[515] (a light amount difference such as represented by dPdown in FIG. 17B), the image adjustment value K[515] is equal to or smaller than the image adjustment value K[516]. In this case, in accordance with Expression (10), the error correction coefficient B1 is set to 1.

In the same manner as in Expression (9) in the third embodiment, the error correction coefficient B2 is also the coefficient for the surface emitting elements each at the position [x] of (516N−1) in the main scanning direction, that is, the adjacent surface emitting elements contained in the different surface emitting element array chips. In addition, when a condition given by (Image Adjustment Value K[x+1]>Image Adjustment Value K[x]) is also satisfied, the error correction coefficient B2 is set to a value given by (Target Light Amount Ptgt/Maximum Light Amount Pmax). When the image adjustment value K[x+1] is equal to or smaller than the image adjustment value K[x], the error correction coefficient B2 is set to 1.

Through execution of such an arithmetic operation in the quasi-medium tone processing portion 423, an arithmetic operation for a quantization error to be diffused can be provided only by a constant-value arithmetic operation given by (Target Light Amount Ptgt/Maximum Light Amount Pmax). As a result, when the arithmetic operation for the quantization error to be diffused is performed by a CPU, an arithmetic operation process can be simplified. Even when the arithmetic operation is performed with hardware, a circuit can be simplified.

As described above, the fourth embodiment allows variations between the respective amounts of light emitted from the individual surface emitting elements to be corrected through use of a smaller amount of image data.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-121822, filed Jun. 27, 2018, which is hereby incorporated by reference herein in its entirety.

What is claimed is:

1. An image forming apparatus comprising:
   a photosensitive member;
   an exposure portion, which includes a plurality of light emitting elements, and is configured to expose the photosensitive member by the plurality of light emitting elements, the exposure portion including:
- a plurality of light emitting element array chips each including the plurality of light emitting elements configured to expose the photosensitive member;
- a drive unit configured to turn ON each of the plurality of light emitting elements based on image data; and
- a light amount control unit configured to adjust a drive current value of a drive current to be supplied to the drive unit for each of the plurality of light emitting element array chips to control an amount of light to be emitted from each of the plurality of light emitting elements of the plurality of light emitting element array chips; and a controller configured to output the image data to the exposure portion to control image formation, the controller including:
- a light amount adjustment unit configured to correct the image data for causing each of the plurality of light emitting elements to emit light based on an adjustment value provided for each of the plurality of light emitting elements, to thereby adjust the amount of light to be emitted from each of the plurality of light emitting elements; and
- a quantization processing unit configured to quantize the image data corrected by the light amount adjustment unit to reduce a number of tones represented by the image data, the quantization processing unit being configured to reflect a quantization error, which is included in the image data corresponding to a target light emitting element after quantization, on image data corresponding to a light emitting element adjacent to the target light emitting element.

2. The image forming apparatus according to claim 1, wherein the image data input to the quantization processing unit is data of two or more bits, and the quantization processing unit quantizes the input image data to reduce a number of bits of the image data.

3. The image forming apparatus according to claim 2, wherein the quantization error is divided based on a positional relationship between the target light emitting element corresponding to the quantized image data and the adjacent light emitting element.

4. The image forming apparatus according to claim 3, wherein the quantization error includes a difference between the image data before the image data is quantized and image data obtained when a number of tones represented by the image data after the image data is quantized is returned to a number of tones before the image data is quantized.

5. The image forming apparatus according to claim 2, wherein the quantization processing unit is configured to correct the quantization error to be diffused to the adjacent light emitting element based on the adjustment value corresponding to the adjacent light emitting element and based on the adjustment value corresponding to the target light emitting element for which the image data is to be quantized.

6. The image forming apparatus according to claim 2, wherein, when the target light emitting element for which the image data is to be quantized and the adjacent light emitting element adjacent to the target light emitting element are contained in different light emitting element array chips, the quantization processing unit corrects the quantization error to be diffused to the adjacent light emitting element based on the adjustment value corresponding to the adjacent light emitting element and based on the adjustment value corresponding to the target light emitting element for which the image data is to be quantized.

7. The image forming apparatus according to claim 2, wherein, when the target light emitting element for which the image data is to be quantized and the adjacent light emitting element adjacent to the target light emitting element are contained in different light emitting element array chips and when the adjustment value corresponding to the adjacent light emitting element is greater than the adjustment value corresponding to the target light emitting element for which the image data is to be quantized, the quantization processing unit corrects the quantization error to be diffused to the adjacent light emitting element based on a predetermined coefficient.

8. The image forming apparatus according to claim 7, wherein the predetermined coefficient is determined based on a target amount of light emitted from each of the light emitting elements when each of the light emitting elements is turned ON at the drive current value and based on a maximum amount of light emitted from each of the light emitting elements.

9. The image forming apparatus according to claim 1, wherein the drive current value is determined based on an amount of light emitted from one of the plurality of light emitting elements that is least among respective amounts of light emitted from the plurality of light emitting elements of each of the light emitting element array chips that are turned ON at the same drive current value.

10. The image forming apparatus according to claim 1, wherein the controller further includes a storage portion configured to store the adjustment value.

11. The image forming apparatus according to claim 1, wherein the adjustment value is determined based on an actual amount of light emitted from each of the light emitting elements when each of the light emitting elements is turned ON at the drive current value and based on a target amount of light emitted from each of the light emitting elements when each of the light emitting elements is turned ON at the drive current value.

12. The image forming apparatus according to claim 1, wherein each of the plurality of light emitting elements is an organic EL element having a surface emitting shape.

* * * * *